(12) United States Patent
Sills et al.

(10) Patent No.: US 10,147,606 B2
(45) Date of Patent: Dec. 4, 2018

(54) METHODS OF FORMING SEMICONDUCTOR DEVICE STRUCTURES INCLUDING LINEAR STRUCTURES SUBSTANTIALLY ALIGNED WITH OTHER STRUCTURES

(71) Applicant: Micron Technology, Inc., Boise, ID (US)

(72) Inventors: Scott E. Sills, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 4 days.

(21) Appl. No.: 15/452,467

(22) Filed: Mar. 7, 2017

(65) Prior Publication Data
US 2018/0261451 A1    Sep. 13, 2018

(51) Int. Cl.
*H01L 21/027* (2006.01)
*H01L 21/768* (2006.01)
(Continued)

(52) U.S. Cl.
CPC .......... *H01L 21/0274* (2013.01); *G03F 7/038* (2013.01); *G03F 7/039* (2013.01);
(Continued)

(58) Field of Classification Search
CPC ............................................... H01L 21/76804
See application file for complete search history.

(56) References Cited

U.S. PATENT DOCUMENTS

2004/0175629 A1* 9/2004 Wasson ..................... G03F 1/32
                                                                    430/5
2006/0091120 A1    5/2006 Markle
(Continued)

FOREIGN PATENT DOCUMENTS

| JP | 2011065136 A | 3/2011 |
|---|---|---|
| KR | 1020130124861 A | 11/2013 |
| WO | 2016179025 A1 | 11/2016 |

OTHER PUBLICATIONS

International Search Report from International Application No. PCT/US2018/020646, dated Jun. 15, 2018, 4 pages.
(Continued)

*Primary Examiner* — Mohammad M Choudhry
(74) *Attorney, Agent, or Firm* — TraskBritt

(57) ABSTRACT

A method of forming a semiconductor device structure comprises forming a preliminary structure comprising a substrate, a photoresist material over the substrate, and a plurality of structures longitudinally extending through the photoresist material and at least partially into the substrate. The preliminary structure is exposed to electromagnetic radiation directed toward upper surfaces of the photoresist material and the plurality of structures at an angle non-orthogonal to the upper surfaces to form a patterned photoresist material. The patterned photoresist material is developed to selectively remove some regions of the patterned photoresist material relative to other regions of the patterned photoresist material. Linear structures substantially laterally aligned with at least some structures of the plurality of structures are formed using the other regions of the patterned photoresist material. Additional methods of forming a semiconductor device structure are also described.

18 Claims, 20 Drawing Sheets

(51) Int. Cl.
*G03F 7/16* (2006.01)
*G03F 7/20* (2006.01)
*G03F 7/26* (2006.01)
*G03F 7/039* (2006.01)
*G03F 7/038* (2006.01)
*G03F 7/38* (2006.01)

(52) U.S. Cl.
CPC .............. *G03F 7/16* (2013.01); *G03F 7/2002* (2013.01); *G03F 7/26* (2013.01); *G03F 7/38* (2013.01); *H01L 21/76802* (2013.01); *H01L 21/76804* (2013.01); *H01L 21/76877* (2013.01)

(56) References Cited

U.S. PATENT DOCUMENTS

2013/0146859 A1   6/2013   Hartmann et al.
2014/0329179 A1   11/2014  Khurana et al.

OTHER PUBLICATIONS

International Written Opinion from International Application No. PCT/US2018/020646, dated Jun. 15, 2018, 5 pages.

\* cited by examiner

US 10,147,606 B2

METHODS OF FORMING SEMICONDUCTOR DEVICE STRUCTURES INCLUDING LINEAR STRUCTURES SUBSTANTIALLY ALIGNED WITH OTHER STRUCTURES

TECHNICAL FIELD

Embodiments of the disclosure relate to the field of semiconductor device design and fabrication. More specifically, embodiments of the disclosure relate to methods of forming semiconductor device structures including linear structures substantially aligned with other structures.

BACKGROUND

Semiconductor device designers often desire to increase the level of integration, which may also be characterized in terms of density, of features within a semiconductor device by reducing the dimensions of the individual features and by reducing the separation distance between neighboring features. In addition, semiconductor device designers often desire to design architectures that are not only compact, but offer performance advantages, as well as simplified designs.

One example of a semiconductor device is a memory device. Memory devices are generally provided as internal integrated circuits in computers or other electronic devices. There are many types of memory including, but not limited to, random-access memory (RAM), read-only memory (ROM), dynamic random access memory (DRAM), synchronous dynamic random access memory (SDRAM), Flash memory, and resistance variable memory. Non-limiting examples of resistance variable memory include resistive random access memory (RRAM), conductive bridge random access memory (conductive bridge RAM), magnetic random access memory (MRAM), phase change material (PCM) memory, phase change random access memory (PCRAM), spin-torque-transfer random access memory (STT-RAM), oxygen vacancy-based memory, and programmable conductor memory.

Various semiconductor device structures (e.g., various memory device structures) are formed using a plurality of processing acts, which often include forming different features (e.g., contact structures, routing structures) aligned with one another over a substrate. Failure to achieve sufficient alignment of the features can render a semiconductor device including the misaligned features inoperative. A conventional way of providing requisite feature alignment is through the use of alignment marks (also referred to in the art as "registration marks"). For example, a mask including an integrated circuit pattern and an alignment mark pattern therein may be utilized in a photolithography process to transfer the integrated circuit pattern and the alignment mark pattern to a photoresist material overlying a substrate, wherein the substrate exhibits an additional alignment mark pattern thereon or therein. The photoresist material is then developed to form a patterned photoresist material exhibiting the integrated circuit pattern and the alignment mark pattern of the mask. Thereafter, the alignment mark pattern of the patterned photoresist material is inspected for alignment with the additional alignment mark pattern of the underlying substrate. If the alignment mark pattern of the patterned photoresist material is not sufficiently aligned with the additional alignment mark pattern of the underlying substrate, the patterned photoresist material is removed (e.g., stripped), re-applied, re-photoexposed, re-developed, and re-inspected for alignment mark pattern misalignment. Such additional, misalignment-imposed processing is inefficient and costly (e.g., increasing processing time as well as energy and material costs).

It would, therefore, be desirable to have new methods of forming semiconductor device structures having aligned features that mitigate one or more of the problems associated with conventional methods of forming such semiconductor device structures.

BRIEF DESCRIPTION OF THE SEVERAL VIEWS OF THE DRAWINGS

FIGS. 1 through 5, including

FIGS. 6 through 10, including

FIGS. 11 through 13, including

DETAILED DESCRIPTION

Figure 1:
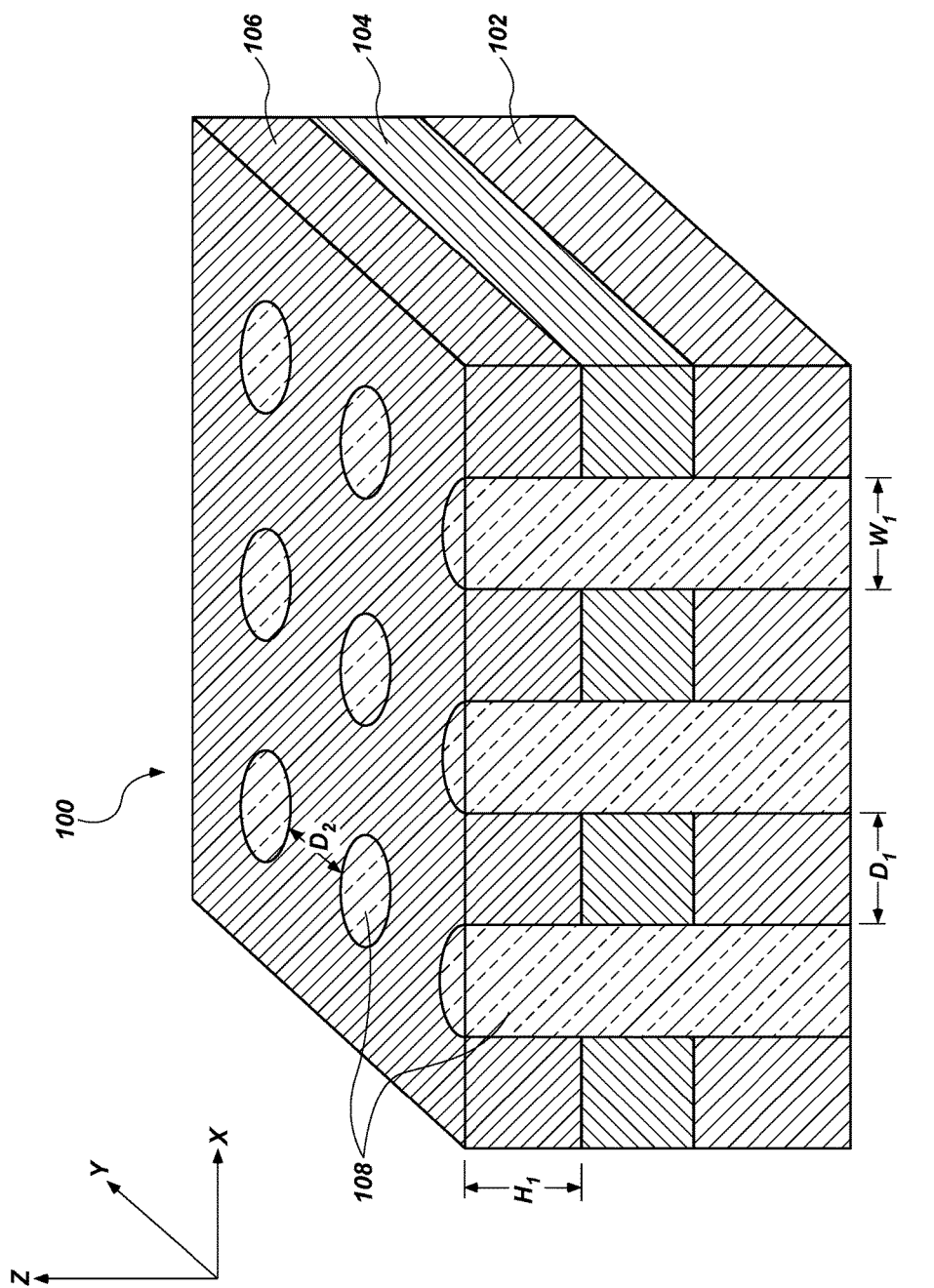

Methods of forming a semiconductor device structure including linear structures substantially aligned with other structures are described herein. The methods of the disclosure may utilize differences in the topography and/or transmissivity of different features (e.g., different materials and/or different structures) of a semiconductor device structure, in combination with or independent from an angle (e.g., a non-orthogonal angle) at which electromagnetic radiation is directed toward one or more upper surfaces of the semiconductor device structure (e.g., upper surfaces of the features), to facilitate the formation of one or more linear structures substantially aligned with one or more groups (e.g., rows, columns) of additional structures individually exhibiting different geometric configurations (e.g., different dimensions and/or different shapes) than the linear structures. The methods of the disclosure may facilitate the self-alignment of the linear structures with the groups of additional structures. The methods disclosed herein may decrease processing complexity, acts, and costs relative to conventional methods of forming semiconductor device structures and semiconductor devices.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, and arrangement of one or more of at least one structure and at least one apparatus facilitating operation of one or more of the structure and the apparatus in a predetermined way.

As used herein, the term "pitch" refers to the distance between identical points in two adjacent structures. By way of non-limiting example, the pitch between centers of two adjacent cylindrical structures may be viewed as the sum of the radii of the adjacent cylindrical structures and any space between the adjacent cylindrical structures. Stated another way, the pitch in the foregoing example may be characterized as the distance between the centers of the adjacent cylindrical structures.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

Figure 2A:
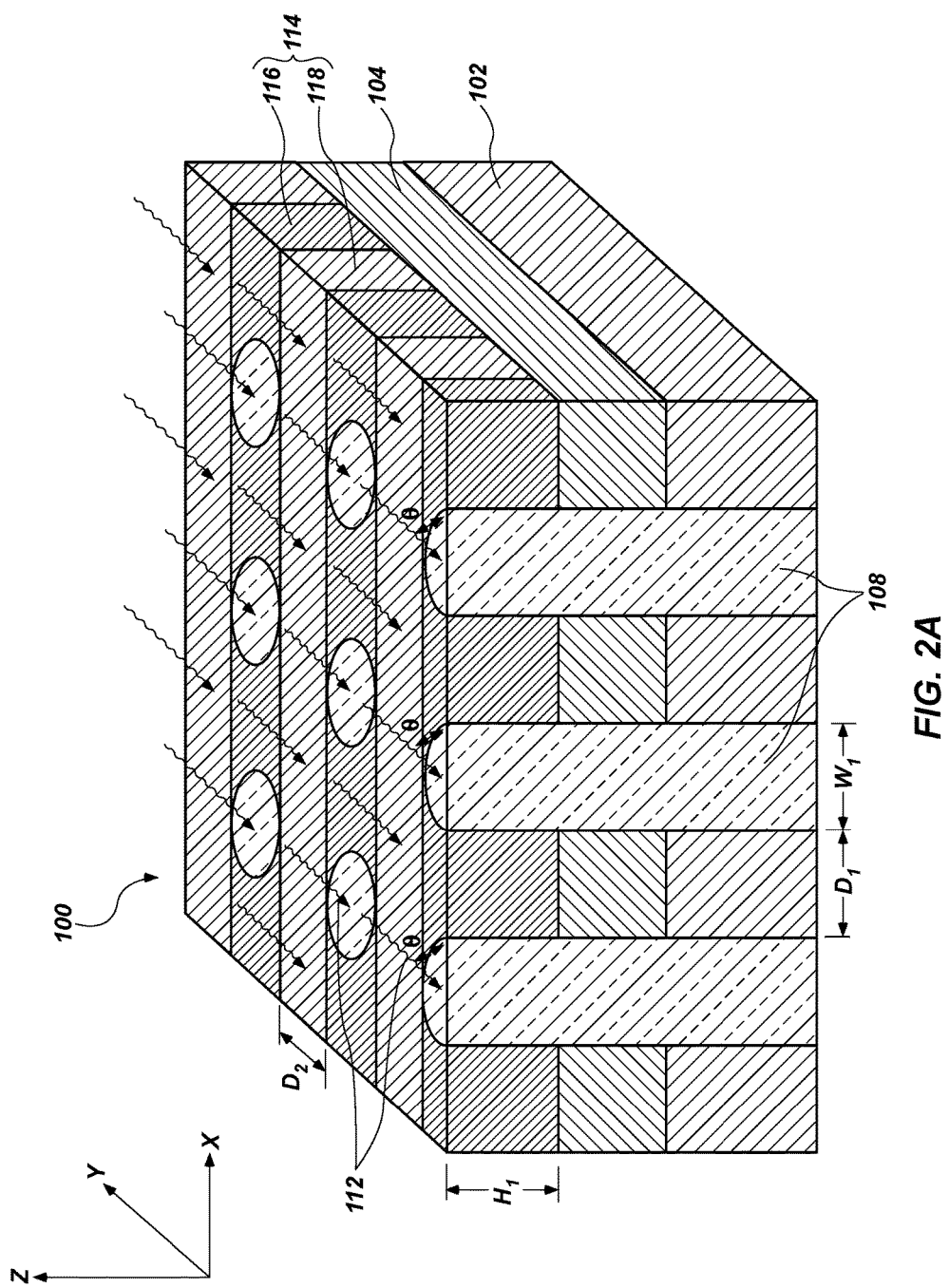
FIGS. 2A through 2C, are perspective, partial cross-sectional (i.e., FIGS. 1, 2A, 3, 4, and 5), side elevation (FIG. 2B), and top-down (FIG. 2C) views illustrating a method of forming a semiconductor device structure, in accordance with embodiments of the disclosure.
Figure 2B:
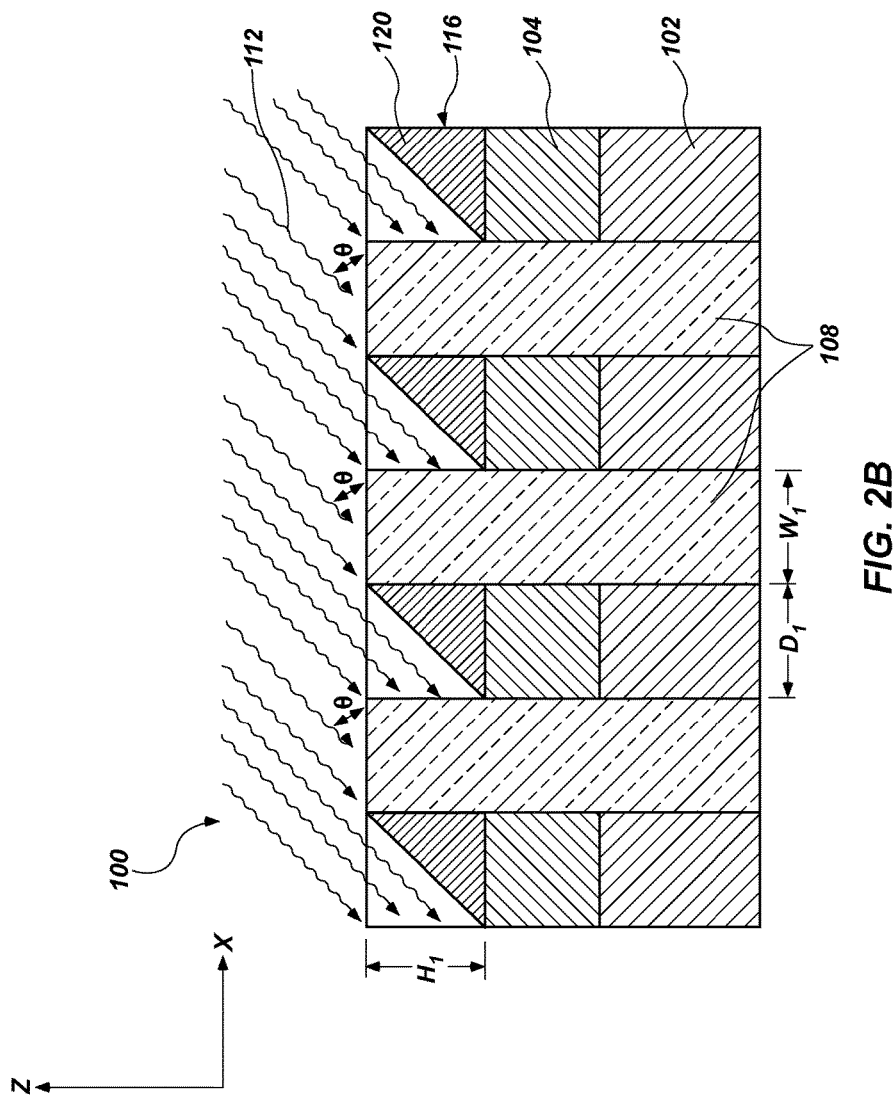
Figure 2C:
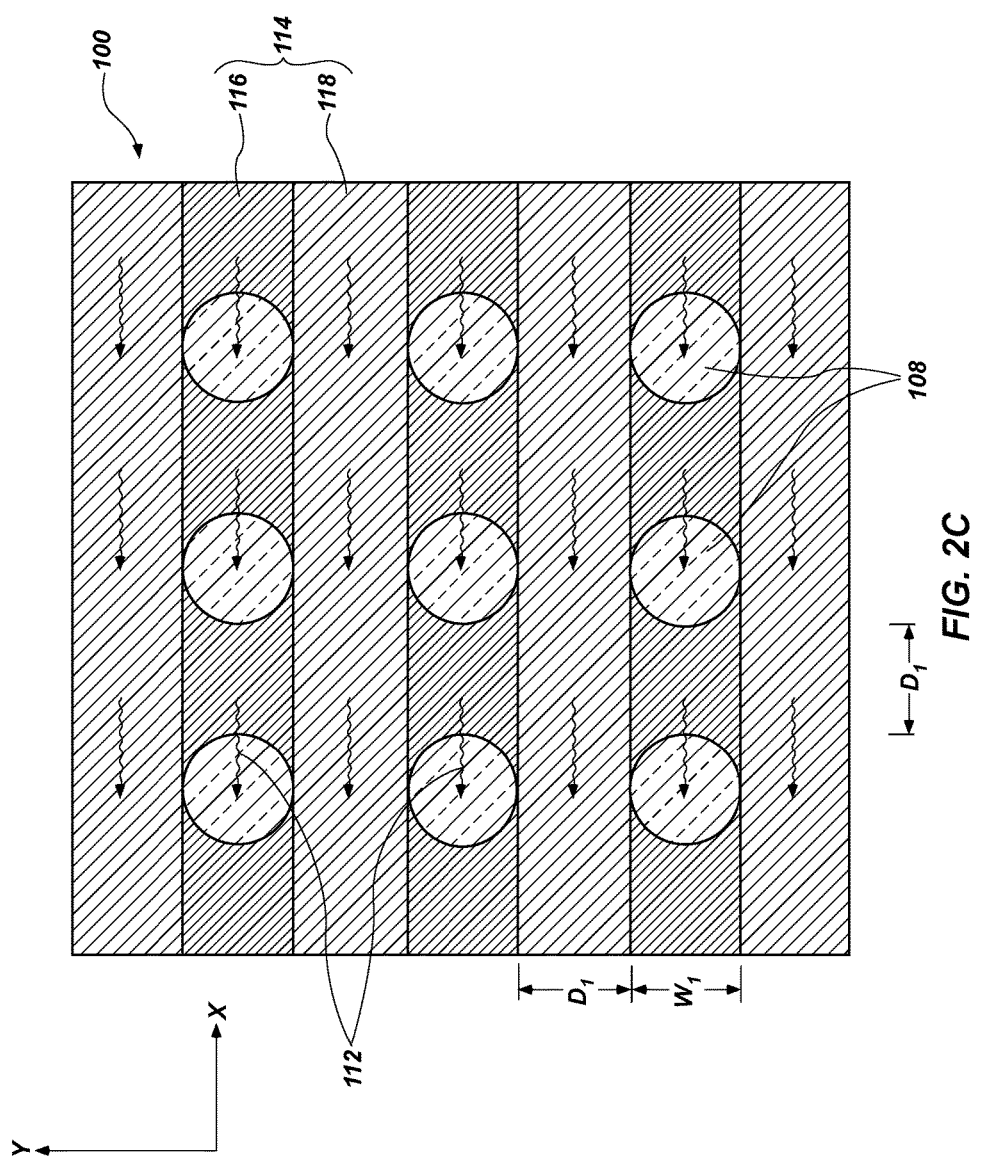

FIGS. 1 through 5, including FIGS. 2A through 2C, are perspective, partial cross-sectional (i.e., FIGS. 1, 2A, and 3 through 5), side elevation (i.e., FIG. 2B), and top-down (i.e., FIG. 2C) views illustrating embodiments of a method of forming a semiconductor device structure, such as a structure of a memory device (e.g., a RAM device, a ROM device, a DRAM device, an SDRAM device, a FLASH memory device, a RRAM device, a conductive bridge RAM device, an MRAM device, a PCM memory device, a PCRAM device, an STT-RAM device, an oxygen vacancy-based memory device, a programmable conductor memory device, etc.). With the description provided below, it will be readily apparent to one of ordinary skill in the art that the methods described herein may be used in various devices (e.g., semiconductor devices, electronic devices, photonic devices, electronic-photonic devices, etc.). In other words, the methods of the disclosure may be used whenever it is desired to form a device including one or more linear structures substantially aligned with other structures.

Referring to FIG. 1, a semiconductor device structure 100 may include a substrate 102, a photoresist material 106 on or over the substrate 102, and structures 108 (e.g., contact structures, vertical interconnect structures, plug structures) longitudinally extending through the photoresist material 106 and at least partially (e.g., substantially) into the substrate 102. Optionally, the semiconductor device structure 100 may also include at least one intervening material 104 positioned longitudinally between the substrate 102 and the photoresist material 106. The intervening material 104 may, for example, be located on an upper surface of the substrate 102, and the photoresist material 106 may be located on an upper surface of the intervening material 104. If the intervening material 104 is present, the structures 108 may longitudinally extend completely through each of the photoresist material 106 and the intervening material 104, and at least partially (e.g., substantially) into the substrate 102.

The substrate 102 may comprise any base material or construction upon which additional materials may be formed. The substrate 102 may be a semiconductor substrate, a base semiconductor material on a supporting structure, a metal electrode, or a semiconductor substrate having one or more materials, structures, or regions formed thereon. The substrate 102 may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped. By way of non-limiting example, a substrate 102 may comprise one or more of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

The intervening material 104, if present, may comprise one or more of a conductive material, a dielectric material, and a semiconductive material. The material composition of the intervening material 104 may at least partially depend upon the material composition of the photoresist material 106, and a selected process (e.g., a damascene process, a subtractive process) for patterning the intervening material 104 using a patterned photoresist material formed from the photoresist material 106, as described in further detail below. In some embodiments, the intervening material 104 comprises at least one conductive material, such as one or more of a metal, a metal alloy, a conductive metal oxide, a conductive metal nitride, a conductive metal silicide, and a conductively doped semiconductor material. By way of non-limiting example, the intervening material 104 may comprise one or more of tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN), titanium silicide (TiSi), titanium silicon nitride (TiSiN), titanium aluminum nitride (TiAlN), molybdenum nitride (MoN), iridium (Ir), iridium oxide (IrO$_x$), ruthenium (Ru), ruthenium oxide (RuO$_x$), and conductively doped silicon. In additional embodiments, the intervening material 104 comprises at least one dielectric material, such as one or more of an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof), a nitride material (e.g., Si$_3$N$_4$), an oxynitride material (e.g., silicon oxynitride), amphorous carbon, or a combination thereof (e.g., a laminate of at least two of the foregoing). If present, the intervening material 104 may be selectively etchable relative to the substrate 102. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater.

The photoresist material 106 may be formed of and include a conventional photoresist, such as a conventional positive tone photoresist, or a conventional negative tone photoresist. If the photoresist material 106 comprises a positive tone photoresist, the photoresist material 106 may be formulated such that regions thereof exposed to at least a minimum threshold dosage of electromagnetic radiation and, optionally, a post-exposure bake become at least partially soluble in a suitable developer (e.g., a positive tone developer). Photoexposed regions (e.g., regions exposed to the minimum threshold dosage of electromagnetic radiation) of the photoresist material 106 may be at least partially (e.g., substantially) removed by the developer while non-photoexposed regions (e.g., regions not exposed to the minimum threshold dosage of electromagnetic radiation) may remain substantially intact (e.g., not substantially removed), as described in further detail below. Alternatively, if the photoresist material 106 comprises a negative tone photoresist, the photoresist material 106 may be formulated such that regions thereof not exposed to at least a minimum threshold dosage of electromagnetic radiation are at least partially soluble in a suitable developer (e.g., a negative tone developer). Non-photoexposed regions of the photoresist material 106 may be at least partially (e.g., substantially) removed by the developer while photoexposed regions may remain substantially intact (e.g., not substantially removed), as also described in further detail below. The properties (e.g., tone) of the photoresist material 106 may be selected relative to material composition of the material(s) (e.g., intervening material 104, if present) underlying the photoresist material 106 to facilitate desired patterning of the material(s), as described in further detail below. Suitable photoresist materials (e.g., positive tone photoresists, negative tone photoresists) are known in the art, and are, therefore, not described in detail herein. The photoresist material 106 may, for example, be compatible with 13.7 nm, 157 nm, 193 nm, 248 nm, or 365 nm wavelength systems; with 193 nm wavelength immersion systems; and/or with electron beam lithographic systems. The photoresist material 106 may exhibit any height H$_1$ (e.g., thickness) conducive to the formation of a patterned photoresist material from the photoresist material 106 through exposing the photoresist material 106 and the structures 108 to beams of electromagnetic radiation directed toward an upper surface of the semiconductor device structure 100 (e.g., upper surfaces of the photoresist material 106 and the structures 108) at a non-orthogonal angle (e.g., a non-right angle, such as an acute angle) relative to the upper surface of the semiconductor device structure 100, as described in further detail below.

The structures 108 may be formed of and include at least one material (e.g. one or more of a conductive material, a dielectric material, and a semiconductive material) having different electromagnetic radiation transmissivity than the photoresist material 106. The structures 108 may impede the transmission of at least some electromagnetic radiation therethrough as compared to the photoresist material 106. Put another way, the structures 108 may be less transmissive (e.g., more opaque) to electromagnetic radiation of one or more wavelengths than the photoresist material 106. As described in further detail below, the transmissivity characteristics of the structures 108 may impede predetermined regions of the photoresist material 106 from being exposed to at least a minimum threshold dosage of electromagnetic radiation during subsequent processing to facilitate photoexposure of the predetermined regions. In some embodiments, the structures 108 comprise at least one conductive material less transmissive to one or more wavelengths of electromagnetic radiation than the photoresist material 106, such as one or more of a metal, a metal alloy, a conductive metal oxide, a conductive metal nitride, a conductive metal silicide, and a conductively doped semiconductor material. By way of non-limiting example, the structures 108 may comprise one or more of W, WN, Ni, Ta, TaN, TaSi, Pt, Cu, Ag, Au, Al, Mo, Ti, TiN, TiSi, TiSiN, TiAlN, MoN, Ir, IrO$_x$, Ru, RuO$_x$, and conductively doped silicon. A material composition of the structures 108 may be substantially the same as or may be different than a material composition of the intervening material 104 (if present) and/or the substrate 102. For example, if the intervening material 104 comprises a conductive material, the structures 108 may comprise the same conductive material as the intervening material 104, or may comprise a different conductive material than the intervening material 104. In some embodiments, the structures 108 and the intervening material 104 comprise substantially the same conductive material. As another example, if the intervening material 104 comprises a dielectric material (e.g., one or more of a dielectric oxide material, a dielectric nitride material, a dielectric oxynitride material, and amphorous carbon), the structures 108 may comprise a conductive material.

As shown in FIG. 1, the semiconductor device structure 100 may include rows of the structures 108 extending in an X-direction and columns of the structures 108 extending in a Y-direction. The X-direction may be substantially perpendicular to the Y-direction. The structures 108 within each row may be substantially aligned with one another, and the structures 108 within each column may also be substantially aligned with one another. For example, adjacent (i.e., neighboring) structures 108 most proximate one another in the X-direction may be substantially aligned with one another in the Y-direction, and other adjacent structures 108 most proximate one another in the Y-direction may be substantially aligned with one another in the X-direction. In additional embodiments, at least partially depending on a desired configuration of a patterned photoresist material to be formed using the structures 108, at least some adjacent structures 108 most proximate one another in the X-direction may be unaligned with (e.g., offset from) one another in the Y-direction, and/or at least some adjacent structures 108 most proximate one another in the Y-direction may be unaligned with (e.g., offset from) one another in the X-direction.

The structures 108 may each individually exhibit any desired dimensions (e.g., length, width, diameter, height) and any desired shape. The dimensions and shapes of the structures 108 may be selected relative to one another and one or more dimensions (e.g., the height $H_1$) of the photoresist material 106 to facilitate the formation of a patterned photoresist material exhibiting desired feature dimensions, shapes, and spacing by exposing the photoresist material 106 and the structures 108 to beams of electromagnetic radiation directed toward an upper surface of the semiconductor device structure 100 (e.g., upper surfaces of the photoresist material 106 and the structures 108) at a non-orthogonal angle relative to the upper surface of the semiconductor device structure 100, as described in further detail below. As shown in FIG. 1, in some embodiments, the structures 108 each exhibit a width $W_1$ (e.g., diameter), and each longitudinally extend (e.g., in a Z-direction) completely through the height $H_1$ of the photoresist material 106 to the upper surface of the photoresist material 106 (e.g., the upper surfaces of the structures 108 are substantially coplanar with the upper surface of the photoresist material 106). In addition, as shown in FIG. 1, in some embodiments, the structures 108 exhibit cylindrical column shapes including substantially circular lateral cross-sectional geometries. In additional embodiments, one or more of the structures 108 may exhibit a different shape, such as a rectangular column shape, a tube shape, a fin shape, a pillar shape, a stud shape, dome shape, a cone shape, a frusto cone shape, a pyramid shape, a frusto pyramid shape, or an irregular shape. Each of the structures 108 may exhibit substantially the same dimensions and substantially the same shape as each other of the structures 108, or one or more of the structures 108 may exhibit at least one different dimension and/or a different shape than one or more other of the structures 108. In some embodiments, each of the structures 108 exhibits substantially the same dimensions and substantially the same shape as each other of the structures 108.

The structures 108 may exhibit any desired spacing relative to one another. The spacing of the structures 108 may be selected relative to the dimensions and shapes of the structures 108 to facilitate the formation of a patterned photoresist material exhibiting desired feature dimensions, shapes, and spacing by exposing the photoresist material 106 and the structures 108 to beams of electromagnetic radiation directed toward an upper surface of the semiconductor device structure 100 (e.g., upper surfaces of the photoresist material 106 and the structures 108) at a non-orthogonal angle relative to the upper surface of the semiconductor device structure 100, as described in further detail below. As shown in FIG. 1, adjacent structures 108 within each row of the structures 108 may be substantially uniformly (e.g., substantially regularly) spaced apart from one another by a first distance $D_1$, and adjacent structures 108 within each column of the structures 108 may be substantially uniformly (e.g., substantially regularly) spaced apart from one another by a second distance $D_2$. The first distance $D_1$ may be substantially the same as the second distance $D_2$, or the first distance $D_1$ may be different than the second distance $D_2$. Accordingly, a pitch between centers of adjacent structures 108 within each of the rows may be substantially constant (e.g., non-variable), and a pitch between centers of adjacent structures 108 within each of the columns may also be substantially constant (e.g., non-variable). In additional embodiments, at least some adjacent structures 108 within at least one row of the structures 108 are spaced apart from one another by a different distance than at least some other adjacent structures 108 within the row, and/or at least some adjacent structures 108 within at least one column of the structures 108 are spaced apart from one another by a different distance than at least some other adjacent structures 108 within the column. Accordingly, a pitch between centers of at least some adjacent structures 108 within at least one row may be different than a pitch between centers of at least some other adjacent structures 108 within the row, and/or a pitch between centers of at least some adjacent structures 108 within at least one column may be different than a pitch between centers of at least some other adjacent structures 108 within the column.

Each of the substrate 102, the intervening material 104 (if present), the photoresist material 106, and the structures 108 may be formed using conventional processes including, conventional material deposition processes (e.g., conventional physical vapor deposition ("PVD") processes, such as sputtering, evaporation, or ionized PVD; conventional chemical vapor deposition ("CVD") processes; conventional atomic layer deposition ("ALD") processes; conventional spin-coating processes), conventional photolithography processes, and conventional material removal processes (e.g., conventional etching processes, such as conventional dry etching processes and conventional wet etching processes; conventional polishing processes, such as conventional chemical-mechanical polishing (CMP) processes). Such processes are known in the art and, therefore, are not described in detail herein. In some embodiments, an initially-deposited (e.g., spin coated) photoresist material is reflowed to form the photoresist material 106. Reflowing the initially-deposited photoresist material may provide the photoresist material 106 with an upper surface substantially coplanar with the surfaces of the structures 108, and may also reduce defects in the photoresist material 106 relative to the initially-deposited photoresist material.

Referring next to FIG. 2A, the photoresist material 106 (FIG. 1) and the structures 108 are subjected to a photoexposure process wherein the photoresist material 106 and the structures 108 are exposed to beams (e.g., rays, waves) of electromagnetic radiation 112 directed toward upper surfaces of the photoresist material 106 and the structures 108 from one or more radiation sources at an angle θ non-orthogonal (e.g., non-perpendicular, non-normal) to the upper surfaces of the photoresist material 106 and the structures 108 to form a patterned photoresist material 114 including non-photoexposed regions 116 and photoexposed regions 118. FIG. 2B is a side elevation view of the semiconductor device structure 100 at the processing stage depicted in FIG. 2A. FIG. 2C is a top-down view of the semiconductor device structure 100 at the processing stage depicted in FIG. 2A.

Depending at least on the tone (e.g., positive tone, or negative tone) of the photoresist material 106 (FIG. 1), the non-photoexposed regions 116 of the patterned photoresist material 114 comprise regions of the patterned photoresist material 114 not exposed to a sufficient dosage (e.g., at least a minimum threshold dosage) of electromagnetic radiation from the radiation sources to facilitate either the substantially complete removal of the regions upon subsequent development (e.g., if the photoresist material 106 comprises a positive tone photoresist material and the developer employed in the subsequent development comprises positive tone developer) or the at least partial (e.g., substantial) maintenance (e.g., preservation, non-removal) of the regions upon subsequent development (e.g., if the photoresist material 106 comprises a negative tone photoresist material and the developer employed in the subsequent development comprises negative tone developer). Accordingly, the photoexposed regions 118 of the patterned photoresist material 114 comprise additional regions of the patterned photoresist material 114 exposed to a sufficient dosage (e.g., at least a minimum threshold dosage) of electromagnetic radiation from the radiation sources to facilitate either the substantially complete removal of the additional regions upon subsequent development or the at least partial (e.g., substantial) maintenance of the additional regions upon subsequent development. Whether the non-photoexposed regions 116 comprise regions of the patterned photoresist material 114 to be substantially removed through subsequent development or comprise regions of the patterned photoresist material 114 to be substantially maintained through subsequent development may at least partially depend on the material composition of the intervening material 104 (if present) to facilitate desired patterning of the intervening material 104 through one or more subsequent processes (e.g., one or more subsequent subtractive processes, or one or more subsequent damascene processes), as described in further detail below.

Referring to FIG. 2B, during the photoexposure process, interactions between the structures 108 and some of the beams of electromagnetic radiation 112 from the radiation sources selectively form (e.g., cast, generate) penumbras 120 (e.g., shadows) within portions of the photoresist material 106 (FIG. 1). The penumbras 120 limit (e.g., obstruct, impede, restrict) electromagnetic radiation exposure within the portions of photoresist material 106 relative to other portions of the photoresist material 106 and form the patterned photoresist material 114 including the non-photoexposed regions 116 (i.e., corresponding to the portions of the photoresist material 106 wherein the penumbras 120 were formed during the photoexposure process) and the photoexposed regions 118 (FIG. 2A) (i.e., corresponding to the other portions of the photoresist material 106 wherein the penumbras 120 were not formed during the photoexposure process). The penumbras 120 may prevent the portions of the photoresist material 106 associated therewith from being exposed to a sufficient amount (e.g., dosage) of electromagnetic radiation to permit the non-photoexposed regions 116 of the patterned photoresist material 114 to have substantially the same solubility in a developer (e.g., a positive tone develop, a negative tone developer) as the photoexposed regions 118 of the patterned photoresist material 114 during subsequent development of the patterned photoresist material 114.

With continued reference to FIG. 2B, the angle θ at which the beams of electromagnetic radiation 112 are directed toward the upper surfaces of the photoresist material 106 (FIG. 1) and the structures 108 may comprise any angle less than 90 degrees (e.g., within a range of from about 0 degrees to about 89 degrees, such as from about 0 degrees and to about 75 degrees, from about 0 degrees and to about 60 degrees, from about 0 degrees and to about 45 degrees, or from about 0 degrees and to about 30 degrees) permitting the penumbras 120 to laterally extend (e.g., in the X-direction; in the Y-direction; in an XY-direction angled relative to the X-direction and the Y-direction, such as a lateral direction oriented at an angle between 0 degree and 90 degrees relative to one or more of the X-direction and the Y-direction, a lateral direction oriented at an angle within a range of from about 10 degrees and to about 80 degrees relative to one or more of the X-direction and the Y-direction, a lateral direction oriented at an angle within a range of from about 30 degrees and to about 60 degrees relative to one or more of the X-direction and the Y-direction, or a lateral direction oriented at an angle of about 45 degrees relative to each of the X-direction and the Y-direction) completely between adjacent structures 108 (e.g., adjacent structures 108 of individual rows of the structures 108; adjacent structures 108 of individual columns of the structures 108; adjacent structures 108 diagonally laterally positioned relative to one another, such as diagonally adjacent structures 108 of adjacent columns of the structures 108, or diagonally adjacent structures 108 of adjacent rows of the structures 108) during the photoexposure process. Laterally extending the penumbras 120 completely between adjacent structures 108 permits the resulting non-photoexposed regions 116 to laterally extend continuously between the adjacent structures 108. At a minimum, the angle θ of the beams of electromagnetic radiation 112 is selected such that a penumbra 120 laterally extends from a sidewall of one of the adjacent structures 108 to a sidewall of the other of the adjacent structures 108 in accordance with the following equation:

$$\theta = \tan^{-1}\left(\frac{H}{D}\right) \quad (1)$$

wherein D is the minimum distance (e.g., the first distance $D_1$, or the second distance $D_2$) between the adjacent structures 108, and H is the height (e.g., the height $H_1$) of the photoresist material 106 (and, hence, the height of the portions of the structures 108 longitudinally extending through the photoresist material 106). However, the angle θ of the beams of electromagnetic radiation 112 may be selected such that the resulting penumbra 120 laterally extends beyond the minimum distance (e.g., beyond the first distance $D_1$, or beyond the second distance $D_2$) between the adjacent structures 108. For example, the angle θ of the beams of electromagnetic radiation 112 may be selected such that one or more of the penumbras 120 overlap one or more other of the penumbras 120. The angle θ of the beams of electromagnetic radiation 112 may be selected such that one or more of the penumbras 120 overlap one or more other of the penumbras 120 laterally adjacent (e.g., in the X-direction, in the Y-direction, in an XY-direction) thereto. Overlapping, adjacent penumbras 120 may form larger penumbras continuously laterally extending across and substantially aligned with individual rows of the structures 108 or individual columns of the structures 108.

The penumbras 120 may exhibit maximum widths substantially corresponding to (e.g., substantially the same as) maximum widths (e.g., the widths $W_1$) of the structures 108 casting the penumbras 120. For example, if the penumbras 120 are formed to laterally extend in the X-direction, the maximum lateral dimensions (e.g., widths) in the Y-direction of the penumbras 120 may be substantially the same as the maximum lateral dimensions (e.g., the widths $W_1$) in the Y-direction of the structures 108 casting the penumbras 120. Outermost lateral boundaries in the Y-direction of the penumbras 120 may be substantially coplanar with outermost lateral boundaries in the Y-direction of the structures 108 casting the penumbras 120. As another example, if the penumbras 120 are formed to laterally extend in the Y-direction, the maximum lateral dimensions (e.g., maximum widths) in the X-direction of the penumbras 120 may be substantially the same as the maximum lateral dimensions (e.g., the widths $W_1$) in the X-direction of the structures 108 casting the penumbras 120. Outermost lateral boundaries in the X-direction of the penumbras 120 may be substantially coplanar with outermost lateral boundaries in the X-direction of the structures 108 associated therewith. As a further example, if the penumbras 120 are formed to laterally extend in an XY-direction, the maximum lateral dimensions (e.g., widths) of the penumbras 120 in an additional XY-direction perpendicular to the XY-direction may be substantially the same as the maximum lateral dimensions in the additional XY-direction of the structures 108 casting the penumbras 120. Outermost lateral boundaries of the penumbras 120 in the additional XY-direction may be substantially coplanar with outermost lateral boundaries in the additional XY-direction of the structures 108 casting the penumbras 120. Each of the penumbras 120 may exhibit substantially the same maximum width (e.g., substantially the same width $W_1$), or at least one of the penumbras 120 may exhibit a different maximum width than at least one other of the penumbras 120. In addition, in embodiments wherein overlapping, adjacent penumbras 120 form larger penumbras continuously laterally extending across and substantially aligned with individual rows of the structures 108 or individual columns of the structures 108, the larger penumbras may each exhibit a substantially uniform (e.g., non-variable) width, or one or more of the larger penumbras may exhibit a non-uniform (e.g., variable) width.

The photoexposure process may expose the photoresist material 106 and the structures 108 to any wavelength(s) of electromagnetic radiation (e.g., ultraviolet (UV) radiation, infrared (IR) radiation, visible radiation) compatible with the photoresist material 106, and capable of forming the penumbras 120 (and, hence, the non-photoexposed regions 116 and the photoexposed regions 118) having maximum lateral dimensions (e.g., maximum widths) corresponding to the maximum lateral dimensions of the structures 108. By way of non-limiting example, the beams of electromagnetic radiation 112 may each individually have a wavelength within a range of from about 10 nm to about 400 nm, such as 13.7 nm, 157 nm, 193 nm, 248 nm, or 365 nm. In some embodiments, each of the beams of electromagnetic radiation 112 has a wavelength of 13.7 nm. In additional embodiments, each of the beams of electromagnetic radiation 112 has a wavelength of 193 nm. The electromagnetic radiation may be polarized (e.g., S-polarized, P-polarized) or may be non-polarized. In addition, the photoexposure process may expose the photoresist material 106 and the structures 108 to a single (e.g., only one) dose of electromagnetic radiation, or may expose the photoresist material 106 and the structures 108 to multiple (e.g., more than one) doses of electromagnetic radiation. If multiple doses of electromagnetic radiation are utilized, each of the multiple doses of electromagnetic radiation may be substantially the same (e.g., substantially the same radiation wavelength(s) and duration), or at least one of the multiple doses of electromagnetic radiation may be different than (e.g., different radiation wavelength(s) and/or different durations) at least one other of the multiple doses of electromagnetic radiation.

The radiation sources may exhibit any configurations, positions (e.g., lateral positions, longitudinal positions), and orientations (e.g., in the X-, Y-, and Z-directions) capable of forming the penumbras 120 (and, hence, the non-photoexposed regions 116 and photoexposed regions 118) to exhibit desired sizes, shapes, and orientations relative to one another and the structures 108. As shown in FIGS. 2A through 2C, in some embodiments, the radiation sources are configured, positioned, and oriented to generate and direct the beams of electromagnetic radiation 112 toward the upper surfaces of the photoresist material 106 (FIG. 1) and the structures 108 in the X-direction and the Z-direction (FIGS. 2A and 2C) (e.g., an XZ-direction) at the angle θ to form the penumbras 120 (FIG. 2C), the non-photoexposed regions 116, and the photoexposed regions 118. In additional embodiments, the radiation sources are configured, positioned, and oriented to generate and direct the beams of electromagnetic radiation 112 toward the upper surfaces of the photoresist material 106 and the structures 108 in the Y-direction and the Z-direction (e.g., a YZ-direction) at the angle θ to form the penumbras 120, the non-photoexposed regions 116, and the photoexposed regions 118. In further embodiments, the radiation sources are configured, positioned, and oriented to generate and direct the beams of electromagnetic radiation 112 toward the upper surfaces of the photoresist material 106 and the structures 108 in the X-direction, the Y-direction, and the Z-direction (e.g., an XYZ-direction) at the angle θ to form the penumbras 120, the non-photoexposed regions 116, and the photoexposed regions 118.

Depending on the configurations, positions, and orientation of the radiation sources during the photoexposure process, the non-photoexposed regions 116 and photoexposed regions 118 of the patterned photoresist material 114 may extend in substantially the same lateral direction (e.g., in the X-direction; in the Y-direction; in an XY-direction angled relative to the X-direction and the Y-direction, such as a lateral direction oriented at an angle between 0 degree and 90 degrees relative to one or more of the X-direction and the Y-direction, a lateral direction oriented at an angle within a range of from about 10 degrees and to about 80 degrees relative to one or more of the X-direction and the Y-direction, a lateral direction oriented at an angle within a range of from about 30 degrees and to about 60 degrees relative to one or more of the X-direction and the Y-direction, or a lateral direction oriented at an angle of about 45 degrees relative to each of the X-direction and the Y-direction). In addition, the photoexposed regions 118 may laterally intervene (e.g., in the Y-direction if the non-photoexposed regions 116 and photoexposed regions 118 extend in the X-direction; in the X-direction if the non-photoexposed regions 116 and photoexposed regions 118 extend in the Y-direction; in an additional XY-direction extending perpendicular to an XY-direction if the non-photoexposed regions 116 and photoexposed regions 118 extend in the XY-direction) between the non-photoexposed regions 116. As shown in FIG. 2C, in some embodiments, the non-photoexposed regions 116 are substantially laterally aligned (in the Y-direction) with rows of the structures 108 extending in the X-direction, and the photoexposed regions 118 are laterally offset (in the Y-direction) from the rows of the structures 108. The non-photoexposed regions 116 may laterally extend in parallel with one another and the photoexposed regions 118 in the X-direction, and may laterally alternate with the photoexposed regions 118 in the Y-direction. In additional embodiments, the non-photoexposed regions 116 are substantially laterally aligned (in the X-direction) with columns of the structures 108 extending in the Y-direction, and the photoexposed regions 118 are laterally offset (in the X-direction) from the columns of the structures 108. The non-photoexposed regions 116 may laterally extend in parallel with one another and the photoexposed regions 118 in the Y-direction, and may laterally alternate with the photoexposed regions 118 in the X-direction. In further embodiments, the non-photoexposed regions 116 are substantially laterally aligned (in an XY-direction) with adjacent structures 108 laterally diagonally positioned relative to one another. The non-photoexposed regions 116 may laterally extend in parallel with one another and the photoexposed regions 118 in an XY-direction, and may laterally alternate with the photoexposed regions 118 in an additional XY-direction oriented perpendicular to the XY-direction.

As shown in FIGS. 2A and 2C, portions of the non-photoexposed regions 116 of the patterned photoresist material 114 may laterally extend substantially continuously between adjacent structures 108 (e.g., adjacent structures 108 of individual rows of the structures 108 if the non-photoexposed regions 116 laterally extend in the X-direction, adjacent structures 108 of individual columns of the structures 108 if the non-photoexposed regions 116 laterally extend in the Y-direction, diagonally adjacent structures 108 if the non-photoexposed regions 116 laterally extend in an XY-direction). For example, the non-photoexposed regions 116 of the patterned photoresist material 114 may directly contact and extend continuously between sidewalls of adjacent structures 108 of individual rows of the structures 108, of adjacent structures 108 of individual columns of the structures 108, or of diagonally adjacent structures 108 of adjacent rows of the structures 108 or adjacent columns of the structures 108. As shown in FIG. 2A, the non-photoexposed regions 116 of the patterned photoresist material 114 may at least partially (e.g., substantially) laterally surround the portions of the structures 108 longitudinally extending (e.g., in the Z-direction) through the patterned photoresist material 114. Accordingly, at least in embodiments wherein the structures 108 are formed of and include a conductive material, the non-photoexposed regions 116 may facilitate the subsequent formation of conductive linear structures extending substantially continuously between and electrically connecting at least some (e.g., all) structures 108 of individual rows of the structures 108, at least some (e.g., all) structures 108 of individual columns of the structures 108, or at least some (e.g., all) diagonally adjacent structures 108 substantially aligned with one another in an XY-direction, as described in further detail below. In addition, the photoexposed regions 118 of the patterned photoresist material 114 may laterally extend substantially continuously across the patterned photoresist material 114 in the same direction (e.g., the X-direction, the Y-direction, or an XY-direction) as the non-photoexposed regions 116.

Referring to FIG. 2C, the non-photoexposed regions 116 of the patterned photoresist material 114 may exhibit maximum widths substantially corresponding to (e.g., substantially the same as) maximum widths of the penumbras 120 (FIG. 2B) used to form the non-photoexposed regions 116. Namely, the non-photoexposed regions 116 exhibit maximum widths substantially corresponding to maximum widths (e.g., the widths $W_1$) of the structures 108 associated therewith (e.g., physically contacting the non-photoexposed regions 116). For example, if the non-photoexposed regions 116 are formed to laterally extend in the X-direction, the maximum lateral dimensions (e.g., widths) in the Y-direction of the non-photoexposed regions 116 may be substantially the same as the maximum lateral dimensions (e.g., the widths $W_1$) in the Y-direction of the structures 108 associated therewith. Outermost lateral boundaries in the Y-direction of each of the non-photoexposed regions 116 may be substantially coplanar with outermost lateral boundaries in the Y-direction of each of the structures 108 associated therewith. As another example, if the non-photoexposed regions 116 are formed to laterally extend in the Y-direction, the maximum lateral dimensions (e.g., maximum widths) in the X-direction of the non-photoexposed regions 116 may be substantially the same as the maximum lateral dimensions (e.g., the widths $W_1$) in the X-direction of the structures 108 associated therewith. Outermost lateral boundaries in the X-direction of each of the non-photoexposed regions 116 may be substantially coplanar with outermost lateral boundaries in the X-direction of each of the structures 108 associated therewith. As a further example, if the non-photoexposed regions 116 are formed to laterally extend in an XY-direction, the maximum lateral dimensions (e.g., widths) of the non-photoexposed regions 116 in an additional XY-direction perpendicular to the XY-direction may be substantially the same as the maximum lateral dimensions in the additional XY-direction of the structures 108 associated therewith. Outermost lateral boundaries of the non-photoexposed regions 116 in the additional XY-direction may be substantially coplanar with outermost lateral boundaries in the additional XY-direction of the structures 108 associated therewith. Each of the non-photoexposed regions 116 may exhibit substantially the same maximum width (e.g., substantially the same width $W_1$), or at least one of the non-photoexposed regions 116 may exhibit a different maximum width than at least one other of the non-photoexposed regions 116.

The photoexposed regions 118 of the patterned photoresist material 114 may exhibit maximum widths substantially corresponding to (e.g., substantially the same as) distances (e.g., the second distances $D_2$, or the first distances $D_1$) between adjacent structures 108 of different rows of the structures 108 (e.g., if the photoexposed regions 118 laterally extend in the X-direction), between different columns of the structures 108 (e.g., if the photoexposed regions 118 laterally extend in the Y-direction), or between adjacent laterally diagonally oriented non-photoexposed regions 116 (e.g., if the photoexposed regions 118 and the non-photoexposed regions 116 laterally extend in an XY-direction). For example, if the photoexposed regions 118 (and, hence, the non-photoexposed regions 116) are formed to laterally extend in the X-direction, the maximum lateral dimensions (e.g., widths) in the Y-direction of the photoexposed regions 118 may be substantially the same as the second distances $D_2$ between adjacent structures 108 in the Y-direction. Outermost lateral boundaries in the Y-direction of each of the photoexposed regions 118 may be substantially coplanar with outermost lateral boundaries in the Y-direction of each of the structures 108 laterally adjacent thereto in the Y-direction. As another example, if the photoexposed regions 118 (and, hence, the non-photoexposed regions 116) are formed to laterally extend in the Y-direction, the maximum lateral dimensions (e.g., widths) in the X-direction of the photoexposed regions 118 may be substantially the same as the first distances $D_1$ between the adjacent structures 108 in the X-direction. Outermost lateral boundaries in the X-direction of each of the photoexposed regions 118 may be substantially coplanar with outermost lateral boundaries in the X-direction of each of the structures 108 laterally adjacent thereto in the X-direction. As a further example, if the photoexposed regions 118 (and, hence, the non-photoexposed regions 116) are formed to laterally extend in an XY-direction, the maximum lateral dimensions (e.g., widths) in of the photoexposed regions 118 in an additional XY-direction oriented perpendicular to the XY-direction may be substantially the same as the distances between adjacent laterally diagonally oriented non-photoexposed regions 116. Outermost lateral boundaries in the additional XY-direction of each of the photoexposed regions 118 may be substantially coplanar with outermost lateral boundaries in the additional XY-direction of each of the non-photoexposed regions 116 laterally adjacent thereto in the additional XY-direction. Each of the photoexposed regions 118 may exhibit substantially the same maximum width, or at least one of the photoexposed regions 118 may exhibit a different maximum width than at least one other of the photoexposed regions 118.

Following the formation of the patterned photoresist material 114 including the non-photoexposed regions 116 and the photoexposed regions 118, the patterned photoresist material 114 is subjected to at least one development process to selectively remove the non-photoexposed regions 116 relative to the photoexposed regions 118, or to selectively remove the photoexposed regions 118 relative to the non-photoexposed regions 116. Which of the non-photoexposed regions 116 and the photoexposed regions 118 is removed by the development process is selected at least partially based on the properties (e.g., material composition) of the structure (s) and/or material(s) (e.g., the intervening material 104, if present) underlying (e.g., directly underlying) the patterned photoresist material 114, and on predetermined processes (e.g., damascene processes, subtractive processes) of forming linear structures (e.g., conductive linear structures) substantially aligned with and connected to (e.g., electrically connected to, physically connected to) at least some adjacent structures 108 (e.g., adjacent structures 108 of rows of the structures 108 extending in the X-direction, adjacent structures 108 of columns of the structures 108 extending in the Y-direction, diagonally adjacent structures 108 of adjacent rows of the structures 108 or of adjacent columns of the structures 108) based on the properties of the structure(s) and/or material(s) underlying the patterned photoresist material 114, as described in further detail below.

Figure 3:
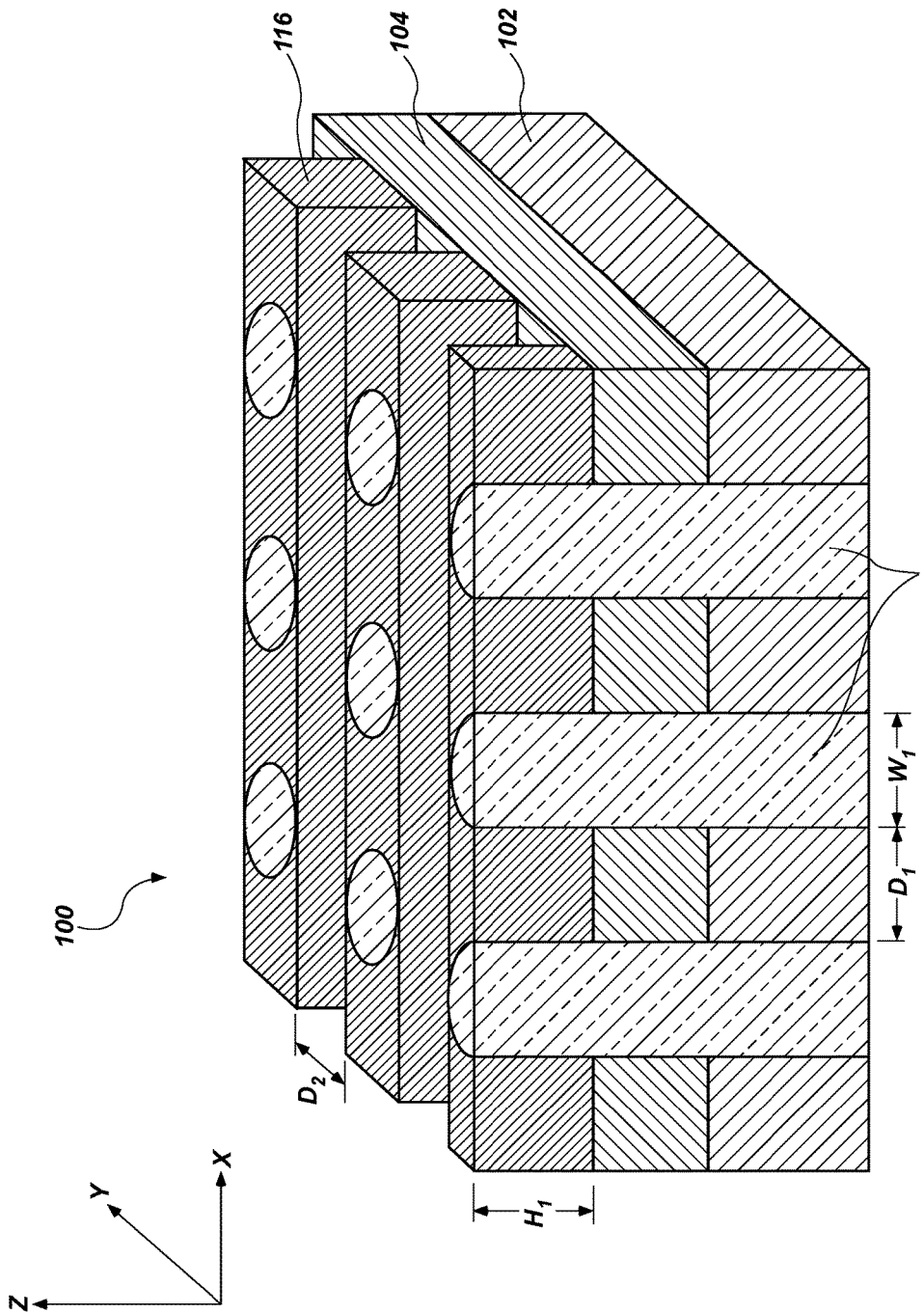

As shown in FIG. 3, in some embodiments, the development process substantially removes the photoexposed regions 118 (FIGS. 2A and 2C) of the patterned photoresist material 114 (FIGS. 2A and 2C), while at least partially (e.g., substantially) maintaining (e.g., keeping, preserving) the non-photoexposed regions 116. For example, if the patterned photoresist material 114 comprises a positive tone resist, the development process may include developing the patterned photoresist material 114 with a positive tone developer to selectively remove the photoexposed regions 118 relative to the non-photoexposed regions 116. Optionally, the patterned photoresist material 114 may be subjected to at least one post-exposure bake to increase the solubility of the photoexposed regions 118 in the positive tone developer prior to the development process. Selectively removing the photoexposed regions 118 of the patterned photoresist material 114 relative to the non-photoexposed regions 116 may, for example, be performed when the material composition(s) of the material(s) (e.g., the intervening material 104, if present) underlying (e.g., directly underlying) the patterned photoresist material 114 facilitate the subsequent formation of linear structures (e.g., conductive linear structures) through at least one subtractive process, as described in further detail below.

Figure 4:
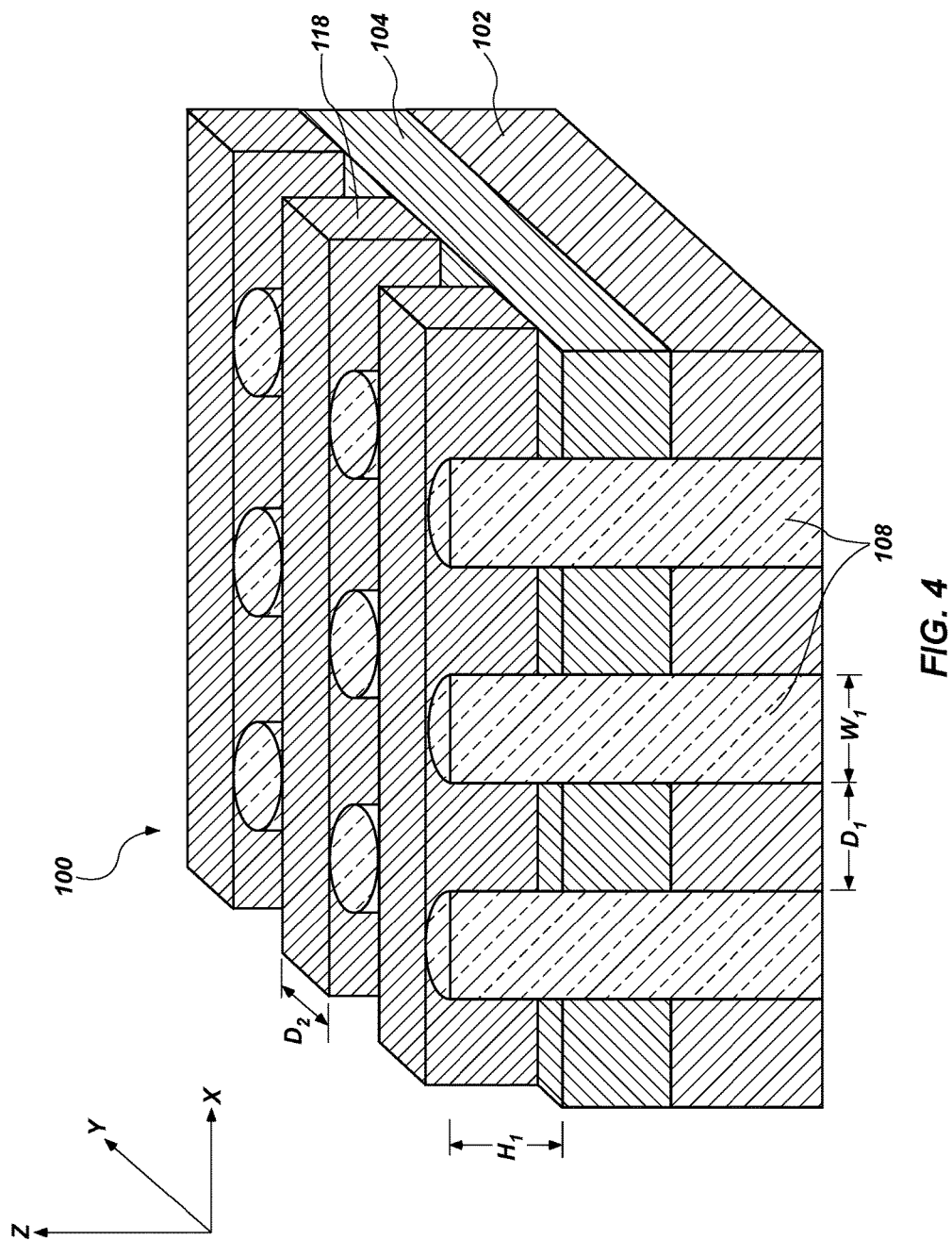

As shown in FIG. 4, in additional embodiments, the development process substantially removes the non-photoexposed regions 116 (FIGS. 2A and 2C) of the patterned photoresist material 114 (FIGS. 2A and 2C), while at least partially (e.g., substantially) maintaining (e.g., keeping, preserving) the photoexposed regions 118. For example, if the patterned photoresist material 114 comprises a negative tone resist, the development process may include developing the patterned photoresist material 114 with a negative tone developer to selectively remove the non-photoexposed regions 116 relative to the photoexposed regions 118. Optionally, the patterned photoresist material 114 may be subjected to at least one post-exposure bake to increase the insolubility of the photoexposed regions 118 in the negative tone developer prior to the development process. Selectively removing the non-photoexposed regions 116 of the patterned photoresist material 114 relative to the photoexposed regions 118 may, for example, be performed when the material composition(s) of the material(s) (e.g., the intervening material 104, if present) underlying (e.g., directly underlying) the patterned photoresist material 114 facilitate the subsequent formation of linear structures (e.g., dielectric linear structures) through at least one damascene process, as described in further detail below.

Figure 5:
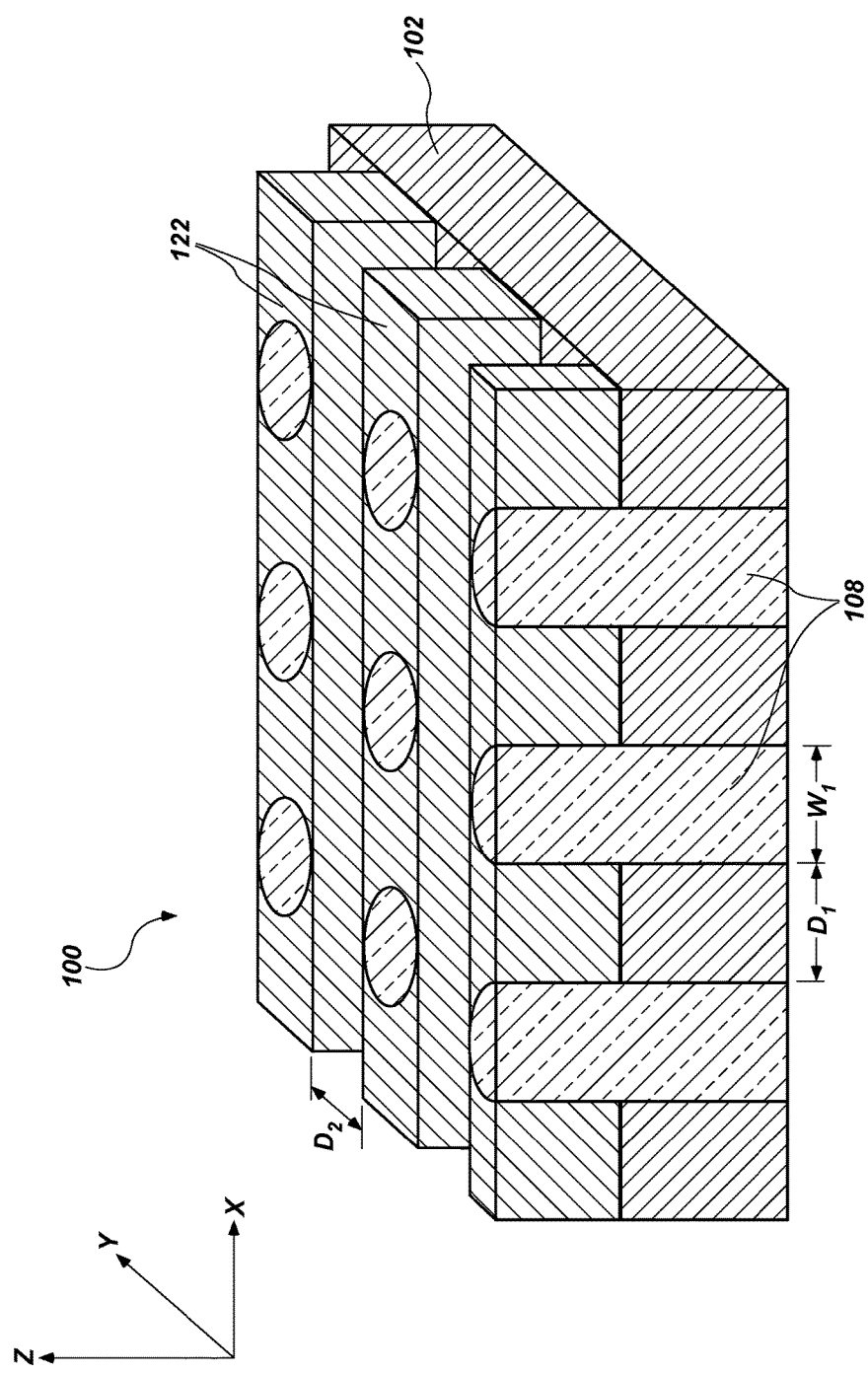

Referring next to FIG. 5, following the removal of the photoexposed regions 118 (FIGS. 2A and 2C) or the non-photoexposed regions 116 (FIGS. 2A and 2C), the remaining non-photoexposed regions 116 (FIG. 3) or the remaining photoexposed regions 118 (FIG. 4) may be used to form linear structures 122 (e.g., line structures, linear routing structures) substantially aligned with, contacting (e.g., physically contacting, electrically contacting), and laterally extending between (e.g., in the X-direction, in the Y-direction, in an XY-direction) at least some adjacent structures 108 (e.g., adjacent structures 108 of rows of the structures 108; adjacent structures 108 of columns of the structures 108; adjacent structures 108 diagonally laterally positioned relative to one another, such as diagonally adjacent structures 108 of adjacent columns of the structures 108, or diagonally adjacent structures 108 of adjacent rows of the structures 108). The linear structures 122 may, for example, be electrically isolated from one another and may electrically connect at least some (e.g., all) structures 108 of individual rows of the structures 108, at least some (e.g., all) structures 108 of individual columns of the structures 108, or at least some (e.g., all) diagonally adjacent structures 108 substantially aligned with one another in an XY-direction. In some embodiments, the linear structures 122 each individually comprise at least one conductive material (e.g., one or more of a metal, a metal alloy, a conductive metal oxide, a conductive metal nitride, a conductive metal silicide, and a conductively doped semiconductor material). For example, if the structures 108 comprise a conductive material, the linear structures 122 may comprise the same conductive material as the structures 108, or may comprise a different conductive material than the structures 108. In some embodiments, the structures 108 and the linear structures 122 comprise substantially the same conductive material. In additional embodiments, one or more the linear structures 122 may comprise a different material, such as a semiconductive material or a dielectric material.

The linear structures 122 may exhibit lateral dimensions, lateral positions, and lateral orientations substantially corresponding to (e.g., substantially the same as) the lateral dimensions, lateral positions, and lateral orientations of the non-photoexposed regions 116 (FIGS. 2A and 2C) of the patterned photoresist material 114 (FIGS. 2A and 2C). Thus, the linear structures 122 may exhibit maximum widths substantially corresponding to maximum widths (e.g., the widths $W_1$) of the structures 108 associated therewith. Accordingly, depending of the lateral orientations of the linear structures 122, outermost lateral boundaries of the linear structures 122 in the Y-direction (e.g., if the linear structures 122 laterally extend between adjacent structures 108 in the X-direction), the X-direction (e.g., if the linear structures 122 laterally extend between adjacent structures 108 in the Y-direction), or an XY-direction (e.g., if the linear structures 122 laterally extend between adjacent structures 108 laterally diagonally positioned relative to one another) may be substantially coplanar with the outermost lateral boundaries in the Y-direction, the X-direction, or the XY-direction of the adjacent structures 108 connected thereto. In addition, the linear structures 122 may be substantially aligned with the adjacent structures 108 connected thereto. For example, as shown in FIG. 5, in some embodiments, individual linear structures 122 are substantially aligned in the Y-direction with adjacent structures 108 of individual rows of the structures 108 extending in the X-direction. In additional embodiments, individual linear structures 122 are substantially aligned in the X-direction with adjacent structures 108 of individual columns of the structures 108 extending in the Y-direction. In further embodiments, individual linear structures 122 are substantially aligned in an XY-direction with adjacent structures 108 laterally diagonally positioned relative to one another.

In embodiments wherein the non-photoexposed regions 116 (FIG. 3) remain following the development process, a subtractive process may be used to form the linear structures 122. By way of non-limiting example, referring to FIG. 3, if the intervening material 104 is present and comprises a conductive material (e.g., a metal, a metal alloy, a conductive metal oxide, a conductive metal nitride, a conductive metal silicide, a conductively doped semiconductor material), the pattern defined by the remaining non-photoexposed regions 116 may transferred into the intervening material 104 using at least one anisotropic etching process (e.g., at least one anisotropic dry etching process, such as at least one of reactive ion etching, deep reactive ion etching, plasma etching, reactive ion beam etching, and chemically assisted ion beam etching; at least one anisotropic wet etching process). During the anisotropic etching process, the remaining non-photoexposed regions 116, upper portions of the structures 108 longitudinally extending through the non-photoexposed regions 116, and unprotected (e.g., exposed) portions of the intervening material 104 may be simultaneously removed. The etch rate of the non-photoexposed regions 116 and the upper portions of the structures 108 may be less than or equal to the etch rate of the intervening material 104. The anisotropic etching process may substantially (e.g., completely) remove the unprotected (e.g., exposed) portions of the intervening material 104, and the remaining portions of the intervening material 104 following the anisotropic etching process form the linear structures 122 (FIG. 5). The linear structures 122 may exhibit substantially the same lateral dimensions (e.g., lengths, widths) as the non-photoexposed regions 116. Thereafter, an isolation material (e.g., a dielectric material) may be formed (e.g., deposited) between the linear structures 122, and at least one polishing process (e.g., at least one chemical-mechanical polishing (CMP) process) may be employed to remove portions of the non-photoexposed regions 116, the structures 108, and the isolation material positioned longitudinally above upper surfaces of the linear structures 122.

In embodiments wherein the photoexposed regions 118 (FIG. 4) remain following the development process, a damascene process may be used to form the linear structures 122. By way of non-limiting example, referring to FIG. 4, if the intervening material 104 is present and comprises a dielectric material (e.g., a dielectric oxide material, a dielectric nitride material, a dielectric oxynitride material, amphorous carbon, combinations thereof), at least one material removal process (e.g., at least one of a wet etching process and a dry etching process) may be used to transfer the pattern defined by the remaining photoexposed regions 118 into the intervening material 104 to form trenches therein. The material removal process may at least partially (e.g., substantially) remove the unprotected (e.g., exposed) portions of the intervening material 104. Thereafter, the trenches may be filled (e.g., through one or more material deposition processes, such as a blanket material deposition process) with a conductive material (e.g., a metal, a metal alloy, a conductive metal oxide, a conductive metal nitride, a conductive metal silicide, a conductively doped semiconductor material), and at least one polishing process (e.g., at least one CMP process) may be used to remove portions of the conductive material, the photoexposed regions 118, and the structures 108 positioned longitudinally above upper boundaries of the trenches to form the linear structures 122. The linear structures 122 may exhibit substantially the same lateral dimensions (e.g., lengths, widths) as the non-photoexposed regions 116 (FIGS. 2A and 2C) of the patterned photoresist material 114 (FIGS. 2A and 2C).

Following the formation of the linear structures 122, the semiconductor device structure 100 may be subjected to additional processing (e.g., additional deposition processes, additional material removal processes), as desired. The additional processing may be conducted by conventional processes and conventional processing equipment, and is not illustrated or described in detail herein.

Thus, in accordance with embodiments of the disclosure, a method of forming a semiconductor device structure comprises forming a preliminary structure comprising a substrate, a photoresist material over the substrate, and a plurality of structures longitudinally extending through the photoresist material and at least partially into the substrate. The preliminary structure is exposed to electromagnetic radiation directed toward upper surfaces of the photoresist material and the plurality of structures at an angle non-orthogonal to the upper surfaces to form a patterned photoresist material. The patterned photoresist material is developed to selectively remove some regions of the patterned photoresist material relative to other regions of the patterned photoresist material. Linear structures substantially laterally aligned with at least some structures of the plurality of structures are formed using the other regions of the patterned photoresist material.

FIGS. 6 through 10, including FIGS. 7A through 7C, 8A and 8B, and 9A and 9B, are perspective, partial cross-sectional (i.e., FIGS. 6, 7A, 8A, 9A, and 10), side elevation (i.e., FIG. 7B), and top-down (i.e., FIGS. 7C, 8B, and 9B) views illustrating embodiments of another method of forming a semiconductor device structure, such as a structure of a memory device (e.g., a RAM device, a ROM device, a DRAM device, an SDRAM device, a Flash memory device, a RRAM device, a conductive bridge RAM device, an MRAM device, a PCM memory device, a PCRAM device, an STT-RAM device, an oxygen vacancy-based memory device, a programmable conductor memory device, etc.). With the description provided below, it will be readily apparent to one of ordinary skill in the art that the method described herein may be used in various devices (e.g., photonic devices, electronic devices, electronic-photonic devices, semiconductor devices). In other words, the methods of the disclosure may be used whenever it is desired to form a device including one or more linear structures substantially aligned with other structures.

Figure 6:
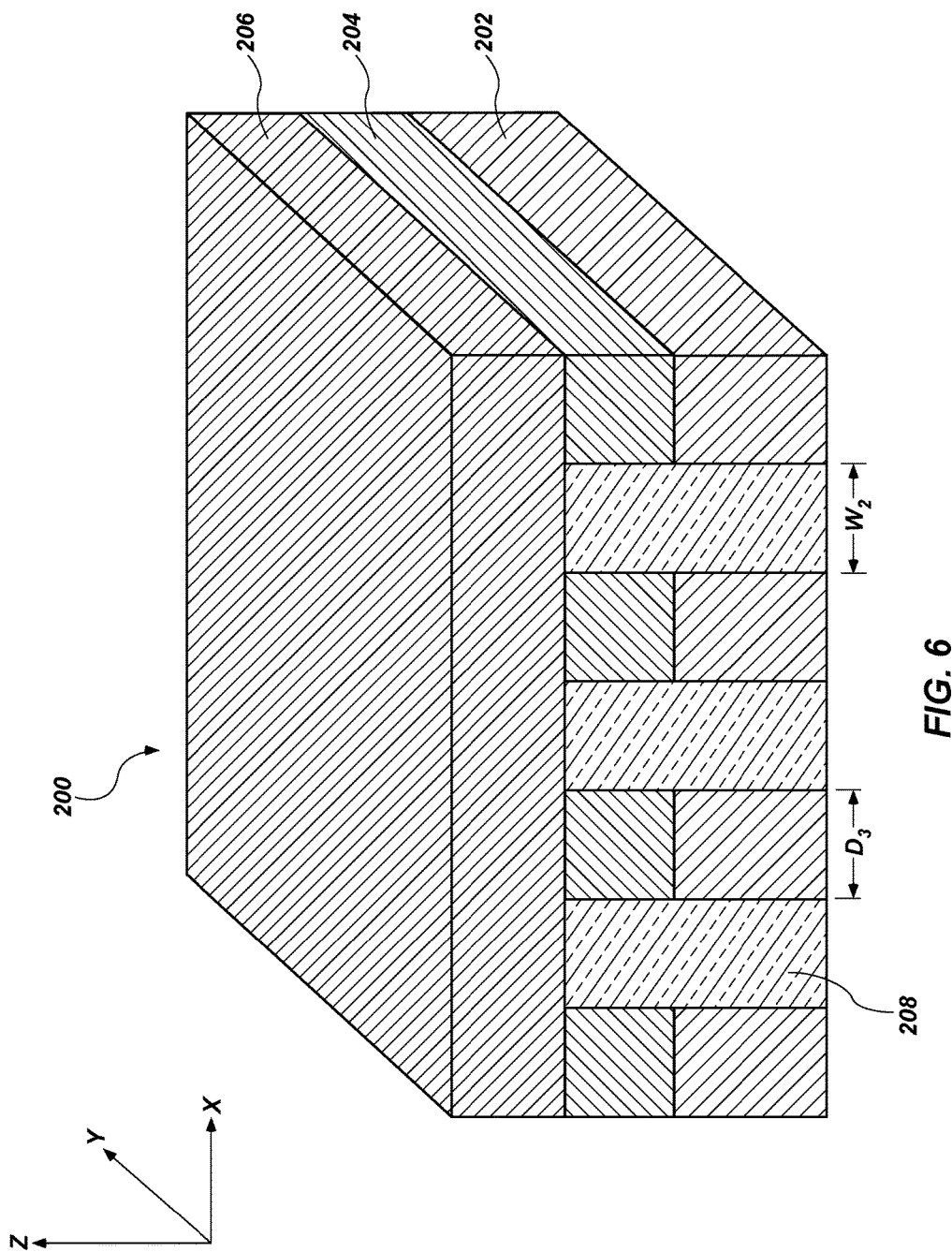

Referring to FIG. 6, a semiconductor device structure 200 may include a substrate 202, a photoresist material 206 on or over the substrate 202, and structures 208 (e.g., contact structures, vertical interconnect structures, plug structures) longitudinally extending from a lower boundary (e.g., a lower surface) of the photoresist material 206 and at least partially (e.g., substantially) into the substrate 202. Optionally, the semiconductor device structure 200 may also include at least one intervening material 204 positioned longitudinally between the substrate 202 and the photoresist material 206. The intervening material 204 may, for example, be located on an upper surface of the substrate 202, and the photoresist material 206 may be located on an upper surface of the intervening material 204. If the intervening material 204 is present, the structures 208 may longitudinally extend from an interface of the intervening material 204 and the photoresist material 206, completely through the intervening material 204, and at least partially (e.g., substantially) into the substrate 202. The substrate 202, the intervening material 204 (if present), and the photoresist material 206 may respectively have material compositions substantially similar to the those of the substrate 102, the intervening material 104, and the photoresist material 106 previously described with reference to FIG. 1.

The structures 208 may be formed of and include at least one material (e.g. one or more of a conductive material, a dielectric material, and a semiconductive material) reflective to one or more wavelengths of electromagnetic radiation to which the semiconductor device structure 200 is subsequently exposed to pattern the photoresist material 206. As described in further detail below, the reflectivity characteristics of the structures 208 may permit predetermined regions of the photoresist material 206 to be exposed to at least a minimum threshold dosage of electromagnetic radiation to facilitate desired photoexposure of the predetermined regions relative to other regions of the photoresist material 206. In some embodiments, the structures 208 comprise at least one conductive material reflective to one or more wavelengths of electromagnetic radiation to which the semiconductor device structure 200 is subsequently exposed, such as one or more of a metal, a metal alloy, a conductive metal oxide, a conductive metal nitride, a conductive metal silicide, and a conductively doped semiconductor material. By way of non-limiting example, the structures 208 may comprise one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. A material composition of the structures 208 may be substantially the same as or may be different than a material composition of the intervening material 204 (if present) and/or the substrate 202.

As shown in FIG. 6, upper surfaces of the structures 208 may be substantially coplanar with lower surfaces of the photoresist material 206 and upper surfaces of the intervening material 204 (if present). Put another way, the photoresist material 206 may be substantially free of portions of the structures 208 longitudinally extending (e.g., in the Z-direction) at least partially therethrough. Aside from the longitudinal dimensions of the structures 208, the structures 208 each individually exhibit dimensions (e.g., lateral dimensions, such as lengths and widths) and shapes substantially similar to one or more of the dimensions and the shapes of the structures 108 previously described with reference to FIG. 1. Each of the structures 208 may exhibit substantially the same dimensions and substantially the same shape as each other of the structures 208, or one or more of the structures 208 may exhibit at least one different dimension and/or a different shape than one or more other of the structures 208. As shown in FIG. 6, in some embodiments, each of the structures 208 exhibit a width $W_2$ (e.g., diameter) and a cylindrical column shape including a substantially circular lateral cross-sectional geometry.

The alignment and spacing of the structures 208 may be substantially similar to the alignment and spacing of the structures 108 previously described with reference to FIG. 1. As shown in FIG. 6, in some embodiments, the semiconductor device structure 200 includes rows of the structures 208 extending in an X-direction and columns of the structures 208 extending in a Y-direction substantially perpendicular to the X-direction. The structures 208 within each row may be substantially aligned with one another, and the structures 208 within each column may also be substantially aligned with one another. In addition, adjacent structures 208 within each row of the structures 208 may be substantially uniformly (e.g., substantially regularly) spaced apart from one another by a first distance $D_3$, and adjacent structures 208 within each column of the structures 208 may be substantially uniformly (e.g., substantially regularly) spaced apart from one another by a second distance $D_4$ (see FIG. 7C). In additional embodiments, at least partially depending on a desired configuration of a patterned photoresist material to be formed using the structures 208, at least some adjacent structures 208 most proximate one another in the X-direction may be unaligned with (e.g., offset from) one another in the Y-direction, and/or at least some adjacent structures 208 most proximate one another in the Y-direction may be unaligned with (e.g., offset from) one another in the X-direction. In further embodiments, at least some adjacent structures 208 within at least one row of the structures 208 may be spaced apart from one another by a different distance than at least some other adjacent structures 208 within the row, and/or at least some adjacent structures 208 within at least one column of the structures 208 may be spaced apart from one another by a different distance than at least some other adjacent structures 208 within the column.

Each of the substrate 202, the intervening material 204 (if present), the photoresist material 206, and the structures 208 may be formed using conventional processes including, conventional material deposition processes (e.g., conventional PVD processes, such as sputtering, evaporation, or ionized PVD; conventional CVD processes; conventional ALD processes; conventional spin-coating processes), conventional photolithography processes, and conventional material removal processes (e.g., conventional etching processes, such as conventional dry etching processes and conventional wet etching processes; conventional polishing processes, such as conventional CMP processes). Such processes are known in the art and, therefore, are not described in detail herein.

Figure 7A:
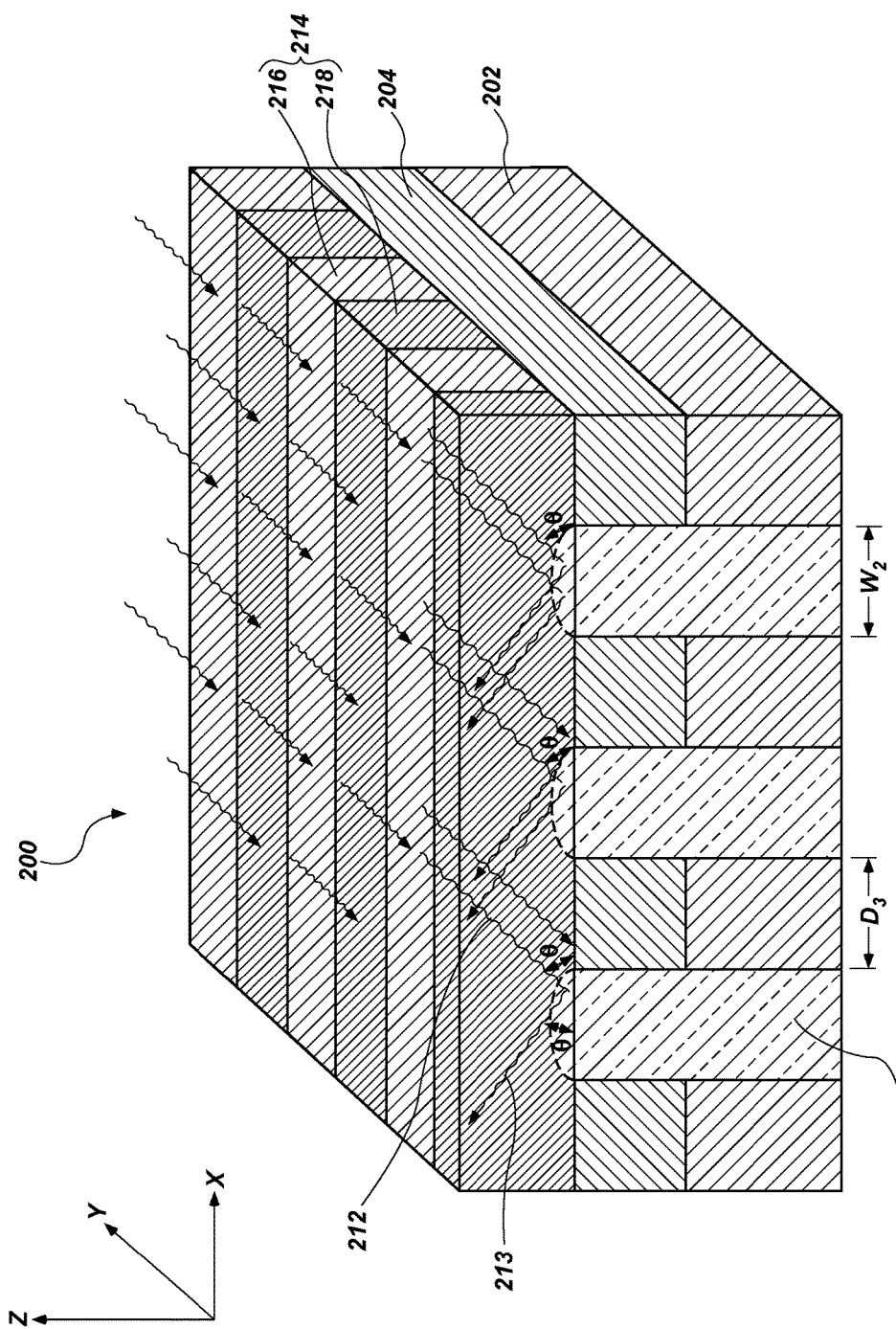
FIGS. 7A through 7C, 8A and 8B, and 9A and 9B, are perspective, partial cross-sectional (i.e., FIGS. 6, 7A, 8A, 9A, and 10), side elevation (FIG. 7B), and top-down (FIGS. 7C, 8B, and 9B) views illustrating another method of forming a semiconductor device structure, in accordance with additional embodiments of the disclosure.
Figure 7B:
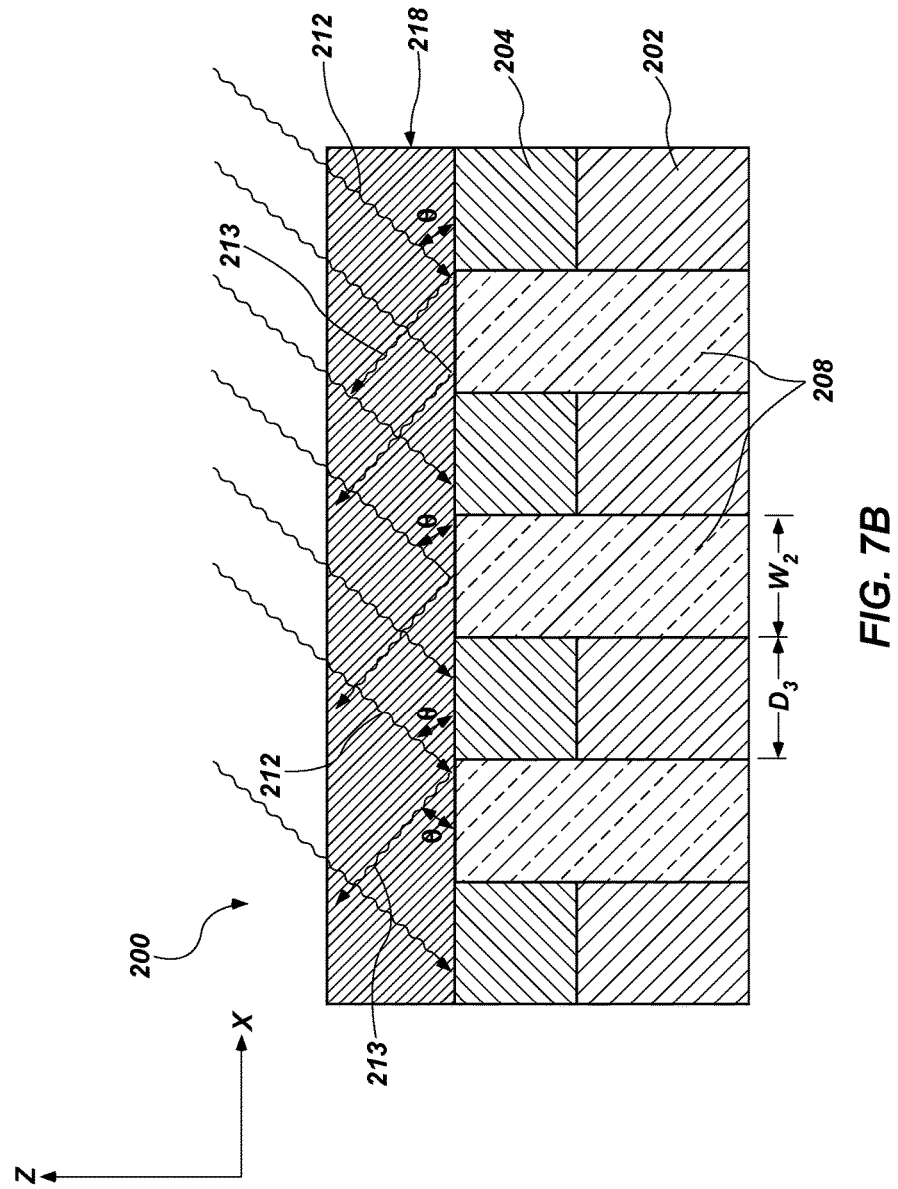
Figure 7C:
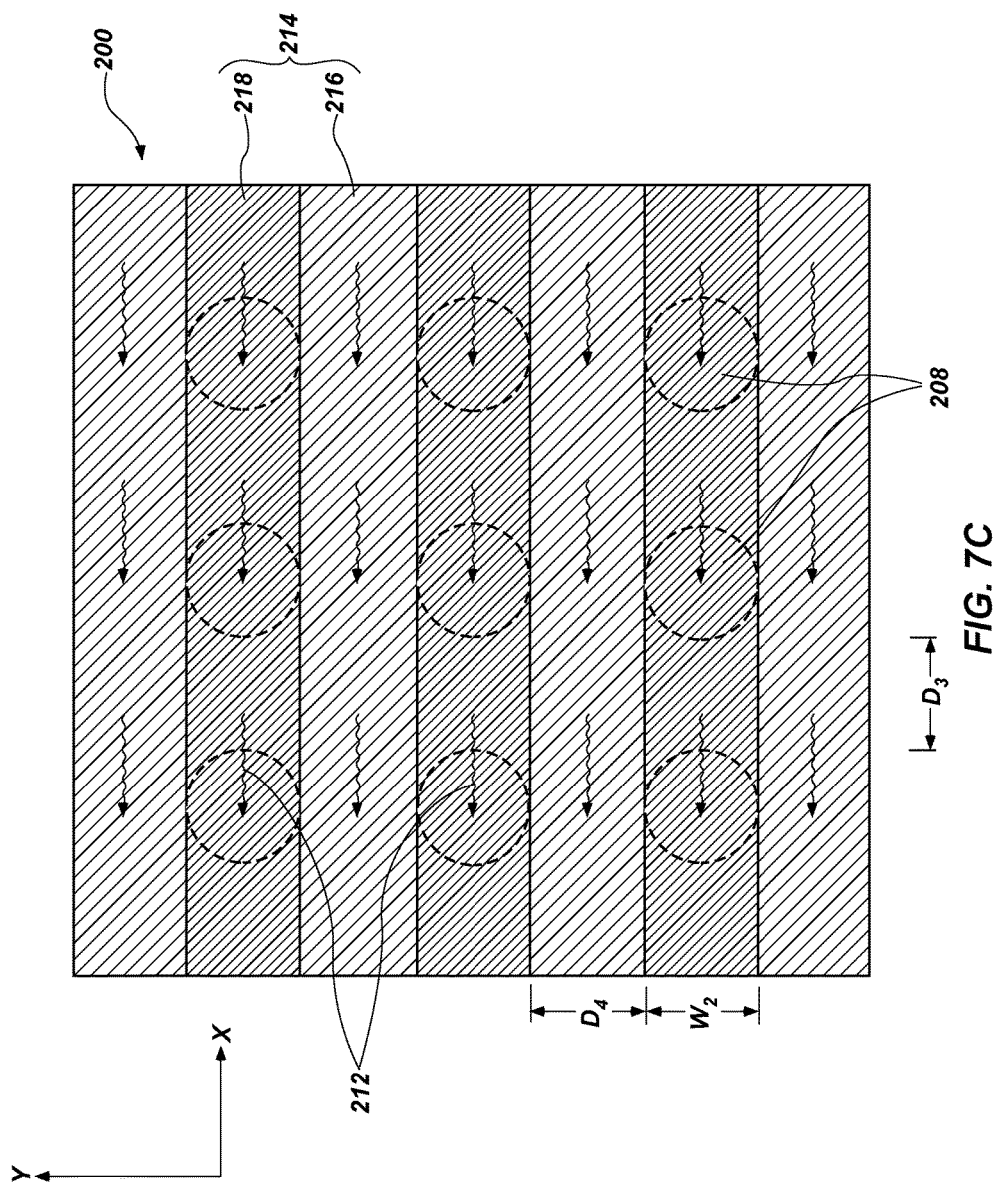

Referring next to FIG. 7A, the semiconductor device structure 200 is subjected to a photoexposure process wherein the photoresist material 206 (FIG. 6) is exposed to beams (e.g., rays, waves) of electromagnetic radiation 212 directed toward an upper surface of the photoresist material 206 from one or more radiation sources at an angle θ non-normal (e.g., non-perpendicular, non-orthogonal) to the upper surface of the photoresist material 206 to form a patterned photoresist material 214 including non-photoexposed regions 216 and photoexposed regions 218. As described in further detail below, the photoexposed regions 218 comprise regions of the photoresist material 206 photoexposed by reflected electromagnetic radiation. FIG. 7B is a side elevation view of the semiconductor device structure 200 at the processing stage depicted in FIG. 7A. FIG. 7C is a top-down view of the semiconductor device structure 200 at the processing stage depicted in FIG. 7A.

Depending at least on the tone (e.g., positive tone, or negative tone) of the photoresist material 206 (FIG. 6), the non-photoexposed regions 216 of the patterned photoresist material 214 comprise regions of the patterned photoresist material 214 not exposed to a sufficient dosage (e.g., at least a minimum threshold dosage) of electromagnetic radiation from the radiation sources to facilitate either the substantially complete removal of the regions upon subsequent development (e.g., if the photoresist material 206 comprises a positive tone photoresist material and the developer employed in the subsequent development comprises positive tone developer) or the at least partial (e.g., substantial) maintenance (e.g., preservation, non-removal) of the regions upon subsequent development (e.g., if the photoresist material 206 comprises a negative tone photoresist material and the developer employed in the subsequent development comprises negative tone developer). Accordingly, the photoexposed regions 218 of the patterned photoresist material 214 comprise additional regions of the patterned photoresist material 214 exposed to a sufficient dosage (e.g., at least a minimum threshold dosage) of electromagnetic radiation from the radiation sources (e.g., through a combination of beams of electromagnetic radiation and reflected beams of electromagnetic radiation) to facilitate either the substantially complete removal of the additional regions upon subsequent development or the at least partial (e.g., substantial) maintenance of the additional regions upon subsequent development. Whether the non-photoexposed regions 216 comprise regions of the patterned photoresist material 214 to be substantially removed through subsequent development or comprise regions of the patterned photoresist material 214 to be substantially maintained through subsequent development may at least partially depend on the material composition of the intervening material 204 (if present) to facilitate desired patterning of the intervening material 204 through one or more subsequent processes (e.g., one or more subsequent subtractive processes, or one or more subsequent damascene processes), as described in further detail below.

During the photoexposure process, as the beams of electromagnetic radiation 212 from the radiation sources are transmitted through the photoresist material 206 (FIG. 6), interactions between the structures 208 and a portion of the beams of electromagnetic radiation 212 reflect the portion of the beams of electromagnetic radiation 212 back into the photoresist material 206 as the reflected beams of electromagnetic radiation 213 to selectively dose portions of the photoresist material 206 with additional radiation. The reflected beams of electromagnetic radiation 213 enhance electromagnetic radiation exposure within the portions of photoresist material 206 relative to other portions of the photoresist material 206 and form the patterned photoresist material 214 including the photoexposed regions 218 (i.e., corresponding to the portions of the photoresist material 206 wherein the reflected beams of electromagnetic radiation 213 were directed back through the photoresist material 206 during the photoexposure process) and the non-photoexposed regions 216 (i.e., corresponding to the other portions of the photoresist material 206 wherein radiation was not directed back through the photoresist material 206 during the photoexposure process). The reflected beams of electromagnetic radiation 213 expose the portions of the photoresist material 206 associated therewith to a sufficient amount (e.g., dosage) of radiation to permit the photoexposed regions 218 of the patterned photoresist material 214 to have a different solubility in a developer (e.g., a positive tone develop, a negative tone developer) than the non-photoexposed regions 216 of the patterned photoresist material 214 during subsequent development of the patterned photoresist material 214.

Referring to FIG. 7B, the angle θ at which the beams of electromagnetic radiation 212 are directed toward the upper surfaces of the photoresist material 206 (FIG. 6) may comprise any angle less than 90 degrees (e.g., between 0 degrees and 90 degrees, such as greater than 0 degrees and less than or equal to 75 degrees, greater than 0 degrees and less than or equal to 60 degrees, greater than 0 degrees and less than or equal to 45 degrees, or greater than 0 degrees and less than or equal to 30 degrees) permitting the formation of the photoexposed regions 218 by the combination of the beams of electromagnetic radiation 212 and the reflected beams of electromagnetic radiation 213. As shown in FIG. 7B, the angle θ permits paths of the reflected beams of electromagnetic radiation 213 to intersect with paths of the beams of electromagnetic radiation 212, such that portions of the photoresist material 206 receive a double dosage of radiation and form the photoexposed regions 218. The double dosage of electromagnetic radiation may permit the portions of the photoresist material 206 to be exposed to at least a minimum threshold dosage of electromagnetic radiation permitting the resulting photoexposed regions 218 to have a different solubility in a developer than the non-photoexposed regions 216. The angle θ may permit the resulting photoexposed regions 218 to be substantially aligned with and continuously laterally extend between adjacent structures 208 (e.g., adjacent structures 208 of individual rows of the structures 208; adjacent structures 208 of individual columns of the structures 208; adjacent structures 208 diagonally laterally positioned relative to one another, such as diagonally adjacent structures 208 of adjacent columns of the structures 208, or diagonally adjacent structures 208 of adjacent rows of the structures 208) of the semiconductor device structure 200. At a minimum, the angle θ of the beams of electromagnetic radiation 212 is selected such that some of the reflected beams of electromagnetic radiation 213 laterally extend from a sidewall of one of the adjacent structures 208 to a sidewall of another of the adjacent structures 208. However, the angle θ of the beams of electromagnetic radiation 212 may be selected such that the resulting reflected beams of electromagnetic radiation 213 laterally extend beyond the minimum distance (e.g., beyond the first distance $D_3$, or beyond the second distance $D_4$) (FIG. 6) between the adjacent structures 208.

The photoexposure process may expose the semiconductor device structure 200 to any wavelength(s) of electromagnetic radiation (e.g., UV radiation, IR radiation, visible radiation) compatible with the photoresist material 206, and capable of forming the photoexposed regions 218 to exhibit maximum lateral dimensions (e.g., maximum widths) corresponding to the maximum lateral dimensions of the structures 208. By way of non-limiting example, the beams of electromagnetic radiation 212 may each individually have a wavelength within a range of from about 10 nm to about 400 nm, such as 13.7 nm, 157 nm, 193 nm, 248 nm, or 365 nm. In some embodiments, each of the beams of electromagnetic radiation 212 has a wavelength of 13.7 nm. In additional embodiments, each of the beams of electromagnetic radiation 212 has a wavelength of 193 nm. The electromagnetic radiation may be polarized (e.g., S-polarized, P-polarized) or may be non-polarized. In addition, the radiation sources may exhibit configurations, positions (e.g., lateral positions, longitudinal positions), and orientations (e.g., in the X-, Y-, and Z-directions) substantially similar to those of the radiation source previously described with reference to FIGS. 2A through 2C. The radiation sources may exhibit configurations, positions, and orientations capable of forming the non-photoexposed regions 216 and photoexposed regions 218 of the patterned photoresist material 214 to exhibit desired sizes, shapes, and orientations relative to one another and the structures 208.

Depending on the configurations, positions, and orientation of the radiation sources during the photoexposure process, the non-photoexposed regions 216 and photoexposed regions 218 of the patterned photoresist material 214 may extend in substantially the same lateral direction (e.g., in the X-direction; in the Y-direction; in an XY-direction angled relative to the X-direction and the Y-direction, such as a lateral direction oriented at an angle between 0 degree and 90 degrees relative to one or more of the X-direction and the Y-direction, a lateral direction oriented at an angle within a range of from about 10 degrees and to about 80 degrees relative to one or more of the X-direction and the Y-direction, a lateral direction oriented at an angle within a range of from about 30 degrees and to about 60 degrees relative to one or more of the X-direction and the Y-direction, or a lateral direction oriented at an angle of about 45 degrees relative to each of the X-direction and the Y-direction). In addition, the non-photoexposed regions 216 may laterally intervene (e.g., in the Y-direction if the non-photoexposed regions 216 and photoexposed regions 218 extend in the X-direction; in the X-direction if the non-photoexposed regions 216 and photoexposed regions 218 extend in the Y-direction; in an additional XY-direction extending perpendicular to an XY-direction if the non-photoexposed regions 216 and photoexposed regions 218 extend in the XY-direction) between the photoexposed regions 218. As shown in FIG. 7C, in some embodiments, the photoexposed regions 218 are substantially laterally aligned (in the Y-direction) with rows of the structures 208 extending in the X-direction, and the non-photoexposed regions 216 are laterally offset (in the Y-direction) from the rows of the structures 208. The photoexposed regions 218 may laterally extend in parallel with one another and the non-photoexposed regions 216 in the X-direction, and may laterally alternate with the non-photoexposed regions 216 in the Y-direction. In additional embodiments, the photoexposed regions 218 are substantially laterally aligned (in the X-direction) with columns of the structures 208 extending in the Y-direction, and the non-photoexposed regions 216 are laterally offset (in the X-direction) from the columns of the structures 208. The photoexposed regions 218 may laterally extend in parallel with one another and the non-photoexposed regions 216 in the Y-direction, and may laterally alternate with the non-photoexposed regions 216 in the X-direction. In further embodiments, the photoexposed regions 218 are substantially laterally aligned (in an XY-direction) with adjacent structures 208 laterally diagonally positioned relative to one another. The photoexposed regions 218 may laterally extend in parallel with one another and the non-photoexposed regions 216 in an XY-direction, and may laterally alternate with the non-photoexposed regions 216 in an additional XY-direction oriented perpendicular to the XY-direction.

As shown in FIGS. 7A and 7C, the photoexposed regions 218 of the patterned photoresist material 214 may longitudinally overly (e.g., in the Z-direction) and laterally extend substantially continuously between adjacent structures 208 (e.g., adjacent structures 208 of individual rows of the structures 208 if the photoexposed regions 218 laterally extend in the X-direction, adjacent structures 208 individual columns of the structures 208 if the photoexposed regions 218 laterally extend in the Y-direction, diagonally adjacent structures 208 if the photoexposed regions 218 laterally extend in an XY-direction). For example, the photoexposed regions 218 of the patterned photoresist material 214 may directly contact and extend continuously between of adjacent structures 208 of individual rows of the structures 108, adjacent structures 108 of individual columns of the structures 108, or diagonally adjacent structures 208 of adjacent rows of the structures 208 or of adjacent columns of the structures 208. The photoexposed regions 218 of the patterned photoresist material 214 may laterally extend substantially continuously across the patterned photoresist material 214 in the same direction as individual rows of the structures 208 thereunder, in the same direction as individual columns of the structures 208 thereunder, or in the same direction as diagonally adjacent structures 108 thereunder. Accordingly, at least in embodiments wherein the structures 208 are formed of and include a conductive material, the photoexposed regions 218 may facilitate the subsequent formation of conductive linear structures extending substantially continuously between and electrically connecting at least some (e.g., all) structures 208 of individual rows of the structures 208, at least some (e.g., all) structures 208 of individual columns of the structures 208, or at least some (e.g., all) diagonally adjacent structures 208 substantially aligned with one another in an XY-direction, as described in further detail below. In addition, the non-photoexposed regions 216 of the patterned photoresist material 214 may laterally extend substantially continuously across the patterned photoresist material 214 in the same direction (e.g., the X-direction, the Y-direction, an XY-direction) as the photoexposed regions 218.

Referring to FIG. 7C, the photoexposed regions 218 of the patterned photoresist material 214 may exhibit maximum widths substantially corresponding to (e.g., substantially the same as) maximum widths (e.g., the widths $W_2$) of the structures 208 associated therewith (e.g., laterally aligned with and longitudinally underlying the photoexposed regions 218). For example, if the photoexposed regions 218 are formed to laterally extend in the X-direction, the maximum lateral dimensions (e.g., widths) in the Y-direction of the photoexposed regions 218 may be substantially the same as the maximum lateral dimensions (e.g., the widths $W_2$) in the Y-direction of the structures 208 associated therewith. Outermost lateral boundaries in the Y-direction of each of the photoexposed regions 218 may be substantially coplanar with outermost lateral boundaries in the Y-direction of each of the structures 208 associated therewith. As another example, if the photoexposed regions 218 are formed to laterally extend in the Y-direction, the maximum lateral dimensions (e.g., maximum widths) in the X-direction of the photoexposed regions 218 may be substantially the same as the maximum lateral dimensions (e.g., the widths $W_2$) in the X-direction of the structures 208 associated therewith (e.g., laterally aligned with and longitudinally underlying the photoexposed regions 218). Outermost lateral boundaries in the X-direction of each of the photoexposed regions 218 may be substantially coplanar with outermost lateral boundaries in the X-direction of each of the structures 208 associated therewith. As a further example, if the photoexposed regions 218 are formed to laterally extend in an XY-direction, the maximum lateral dimensions (e.g., widths) of the photoexposed regions 218 in an additional XY-direction perpendicular to the XY-direction may be substantially the same as the maximum lateral dimensions in the additional XY-direction of the structures 208 associated therewith. Outermost lateral boundaries of the photoexposed regions 218 in the additional XY-direction may be substantially coplanar with outermost lateral boundaries in the additional XY-direction of the structures 208 associated therewith. Each of the photoexposed regions 218 may exhibit substantially the same maximum width (e.g., substantially the same width $W_2$), or at least one of the photoexposed regions 218 may exhibit a different maximum width than at least one other of the photoexposed regions 218.

The non-photoexposed regions 216 of the patterned photoresist material 214 may exhibit maximum widths substantially corresponding to (e.g., substantially the same as) distances (e.g., the second distances $D_4$, or the first distances $D_3$) between adjacent structures 208 of different rows of the structures 208 (e.g., if the non-photoexposed regions 216 laterally extend in the X-direction), different columns of the structures 208 (e.g., if the non-photoexposed regions 216 laterally extend in the Y-direction), or between adjacent laterally diagonally oriented photoexposed regions 218 (e.g., if the photoexposed regions 218 and the non-photoexposed regions 216 laterally extend in an XY-direction). For example, if the non-photoexposed regions 216 (and, hence, the photoexposed regions 218) are formed to laterally extend in the X-direction, the maximum lateral dimensions (e.g., widths) in the Y-direction of the non-photoexposed regions 216 may be substantially the same as the second distances $D_4$ between adjacent structures 208 in the Y-direction. Outermost lateral boundaries in the Y-direction of each of the non-photoexposed regions 216 may be substantially coplanar with outermost lateral boundaries in the Y-direction of each of the structures 208 laterally adjacent thereto in the Y-direction. As another example, if the non-photoexposed regions 216 (and, hence, the photoexposed regions 218) are formed to laterally extend in the Y-direction, the maximum lateral dimensions (e.g., widths) in the X-direction of the non-photoexposed regions 216 may be substantially the same as the first distances $D_3$ between the adjacent structures 208 in the X-direction. Outermost lateral boundaries in the X-direction of each of the non-photoexposed regions 216 may be substantially coplanar with outermost lateral boundaries in the X-direction of each of the structures 208 laterally adjacent thereto in the X-direction. As a further example, if the non-photoexposed regions 216 (and, hence, the photoexposed regions 218) are formed to laterally extend in an XY-direction, the maximum lateral dimensions (e.g., widths) in of the non-photoexposed regions 216 in an additional XY-direction oriented perpendicular to the XY-direction may be substantially the same as the distances between adjacent laterally diagonally oriented photoexposed regions 218. Outermost lateral boundaries in the additional XY-direction of each of the non-photoexposed regions 216 may be substantially coplanar with outermost lateral boundaries in the additional XY-direction of each of the photoexposed regions 218 laterally adjacent thereto in the additional XY-direction. Each of the non-photoexposed regions 216 may exhibit substantially the same maximum width, or at least one of the non-photoexposed regions 216 may exhibit a different maximum width than at least one other of the non-photoexposed regions 216.

Following the formation of the patterned photoresist material 214 including the non-photoexposed regions 216 and the photoexposed regions 218, the patterned photoresist material 214 is subjected to at least one development process to selectively remove the photoexposed regions 218 relative to the non-photoexposed regions 216, or to selectively remove the non-photoexposed regions 216 relative to the photoexposed regions 218. Which of the non-photoexposed regions 216 and the photoexposed regions 218 is removed by the development process is selected at least partially based on the properties (e.g., material composition) of the structure(s) (e.g., the structures 208) and/or material(s) (e.g., the intervening material 204, if present) underlying (e.g., directly underlying) the patterned photoresist material 214, and on predetermined processes (e.g., damascene processes, subtractive processes) of forming linear structures (e.g., conductive linear structures) substantially aligned with and connected to (e.g., electrically connected to, physically connected to) at least some adjacent structures 208 (e.g., adjacent structures 208 of rows of the structures 208 extending in the X-direction, adjacent structures 208 of columns of the structures 208 extending in the Y-direction, diagonally adjacent structures 208 of adjacent rows of the structures 208 or of adjacent columns of the structures 208) based on the properties of the structure(s) and/or material(s) underlying the patterned photoresist material 214, as described in further detail below.

Figure 8A:
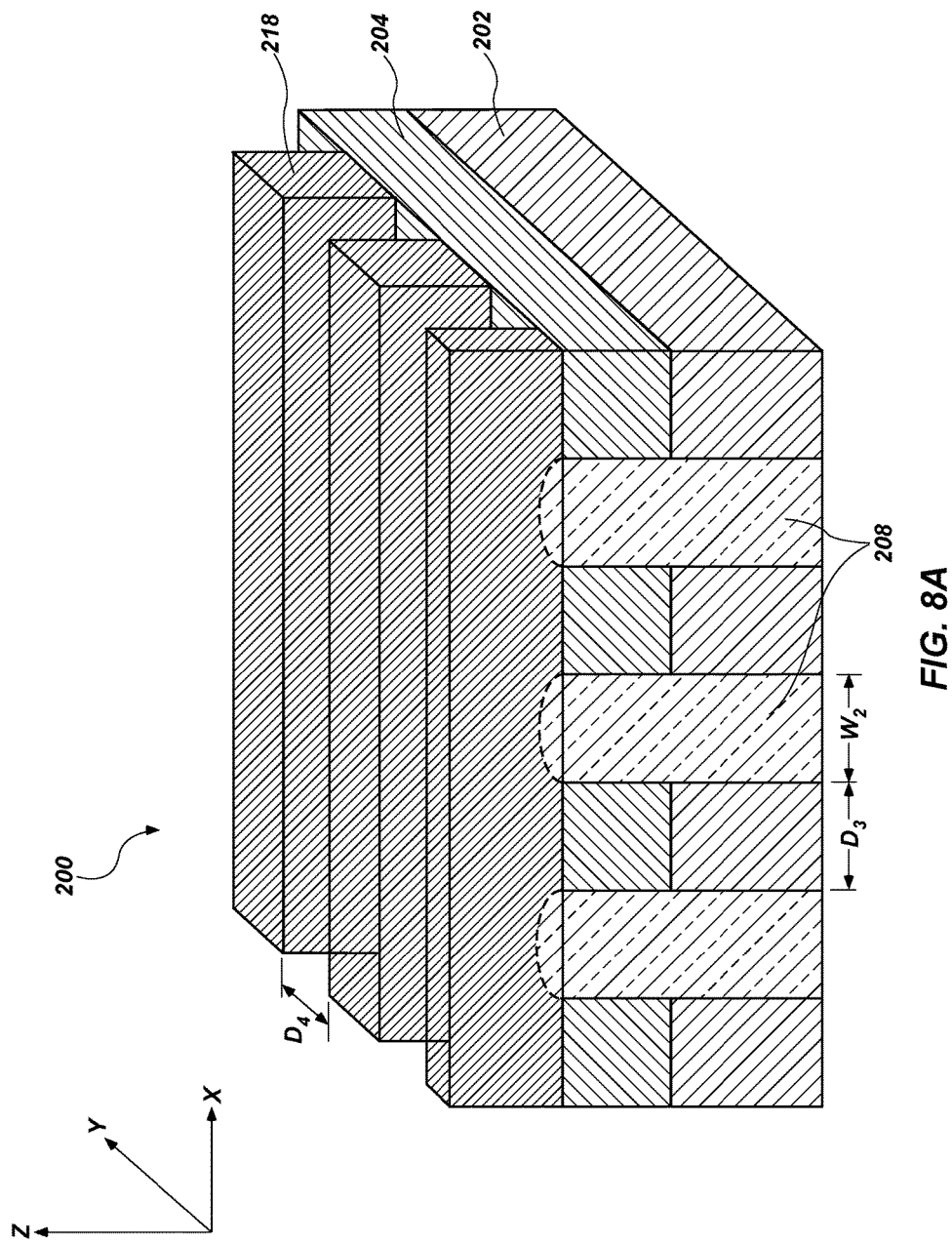
Figure 8B:
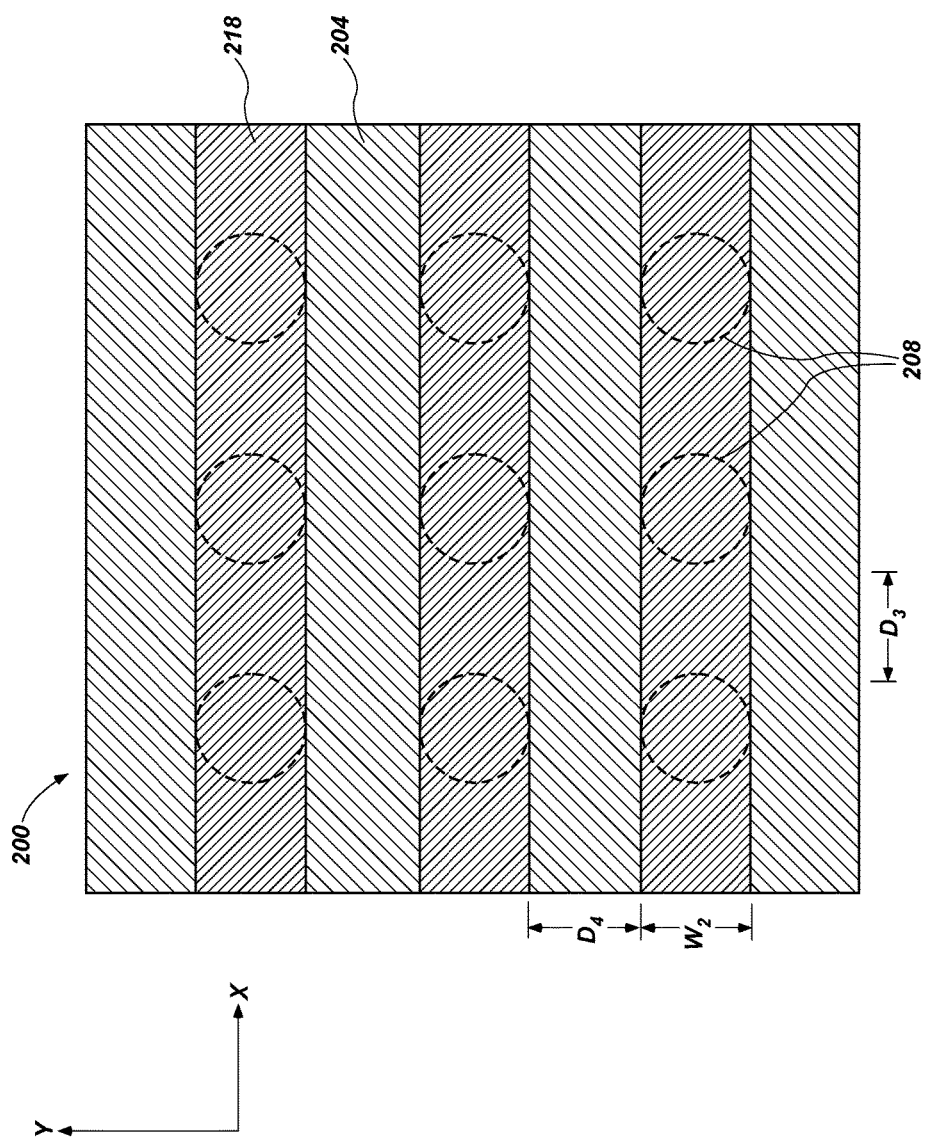

As shown in FIG. 8A, in some embodiments, the development process substantially removes the non-photoexposed regions 216 (FIGS. 7A and 7C) of the patterned photoresist material 214 (FIGS. 7A and 7C), while at least partially (e.g., substantially) maintaining (e.g., keeping, preserving) the photoexposed regions 218. For example, if the patterned photoresist material 214 comprises a negative tone resist, the development process may include developing the patterned photoresist material 214 with a positive tone developer to selectively remove the non-photoexposed regions 216 relative to the photoexposed regions 218. Optionally, the patterned photoresist material 214 may be subjected to at least one post-exposure bake to increase the insolubility of the photoexposed regions 218 in the negative tone developer prior to the development process. Selectively removing the non-photoexposed regions 216 of the patterned photoresist material 214 relative to the photoexposed regions 218 may, for example, be performed when the material composition(s) of the structure(s) (e.g., the structures 208) and/or material(s) (e.g., the intervening material 204, if present) underlying (e.g., directly underlying) the patterned photoresist material 214 facilitate the subsequent formation of linear structures (e.g., conductive linear structures) through at least one subtractive process, as described in further detail below. FIG. 8B is a top-down view of the semiconductor device structure 200 at the processing step depicted in FIG. 8A, wherein lateral boundaries of the structures 208 underlying the remaining photoexposed regions 218 are depicted with dashed lines.

Figure 9A:
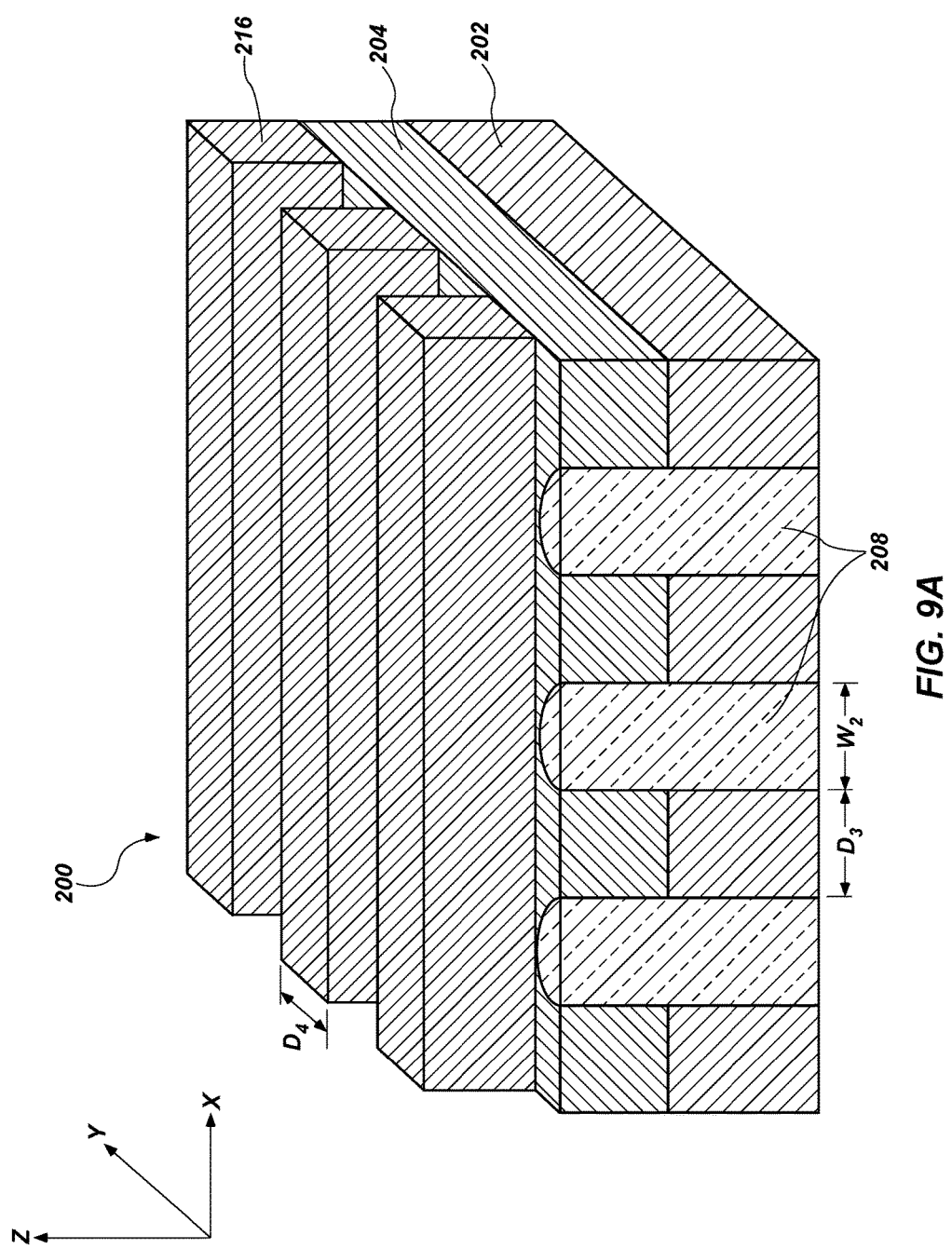
Figure 9B:
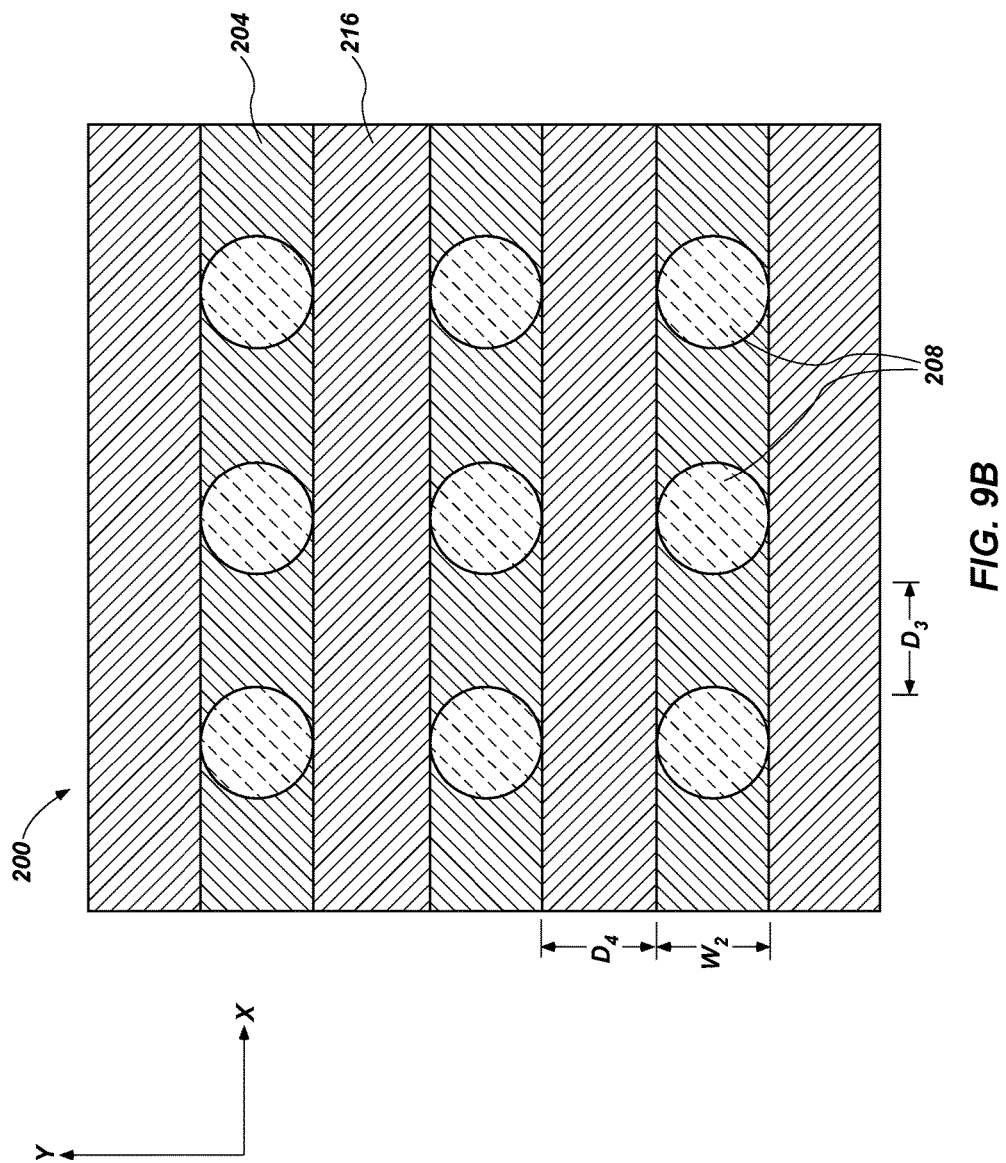

As shown in FIG. 9A, in additional embodiments, the development process substantially removes the photoexposed regions 218 (FIGS. 7A and 7C) of the patterned photoresist material 214 (FIGS. 7A and 7C), while at least partially (e.g., substantially) maintaining (e.g., keeping, preserving) the non-photoexposed regions 216. For example, if the patterned photoresist material 214 comprises a positive tone resist, the development process may include developing the patterned photoresist material 214 with a positive tone developer to selectively remove the photoexposed regions 218 relative to the non-photoexposed regions 216. Optionally, the patterned photoresist material 214 may be subjected to at least one post-exposure bake to increase the solubility of the photoexposed regions 218 in the positive tone developer prior to the development process. Selectively removing the photoexposed regions 218 of the patterned photoresist material 214 relative to the non-photoexposed regions 216 may, for example, be performed when the material composition(s) of the structure(s) (e.g., the structures 208) and/or material(s) (e.g., the intervening material 204, if present) underlying (e.g., directly underlying) the patterned photoresist material 214 facilitate the subsequent formation of linear structures (e.g., conductive linear structures) through at least one damascene process, as described in further detail below. FIG. 9B is a top-down view of the semiconductor device structure 200 at the processing step depicted in FIG. 9A.

Figure 10:
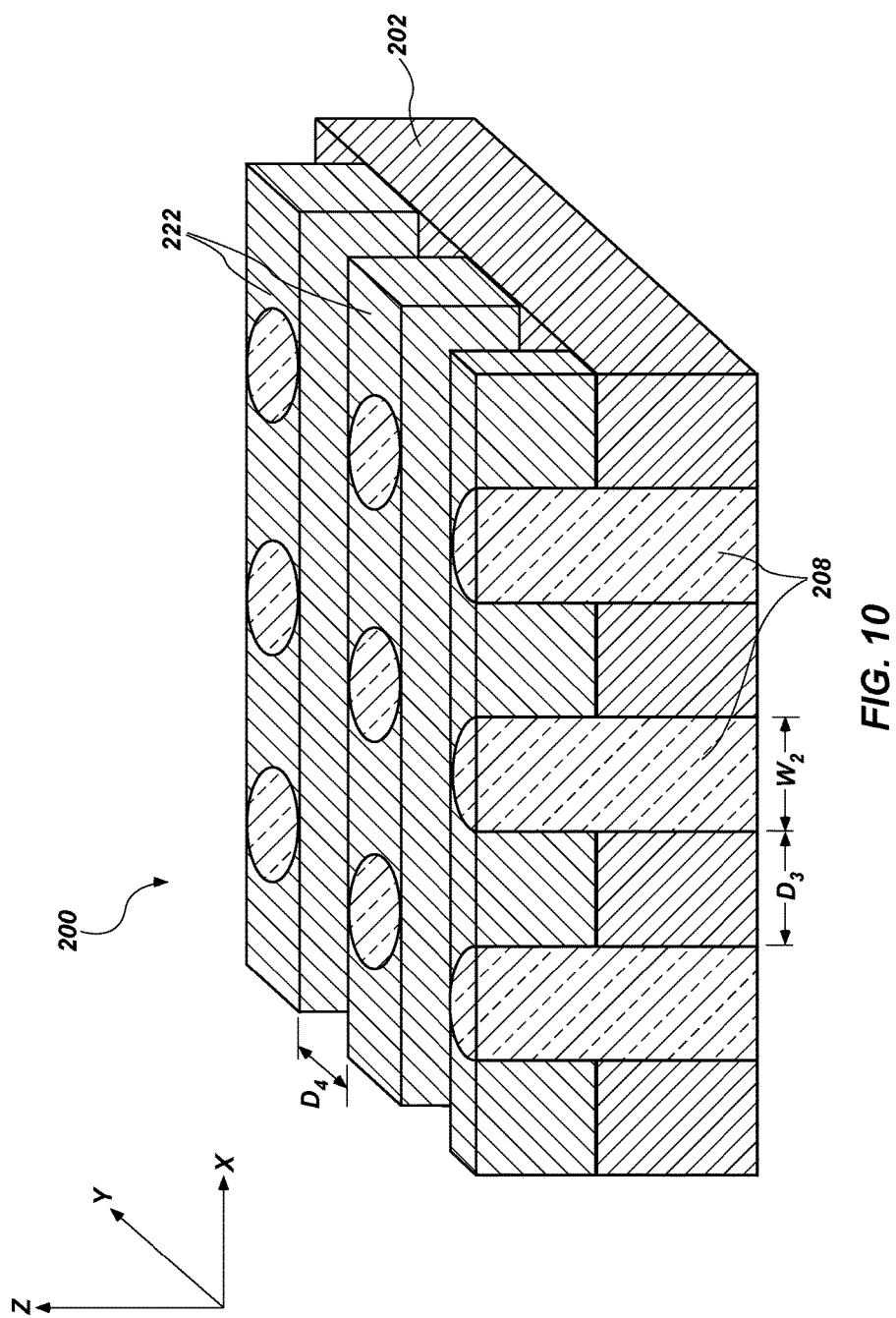

Referring next to FIG. 10, following the removal of the non-photoexposed regions 216 (FIGS. 7A and 7C) or the photoexposed regions 218 (FIGS. 7A and 7C), the remaining photoexposed regions 218 (FIGS. 8A and 8B) or the remaining non-photoexposed regions 216 (FIGS. 9A and 9B) may be used to form linear structures 222 (e.g., line structures, linear routing structures) substantially aligned with, contacting (e.g., physically contacting, electrically contacting), and laterally extending between (e.g., in the X-direction, in the Y-direction, in an XY-direction) at least some adjacent structures 208 (e.g., adjacent structures 208 of rows of the structures 208; adjacent structures 208 of columns of the structures 208; adjacent structures 208 diagonally laterally positioned relative to one another, such as diagonally adjacent structures 208 of adjacent columns of the structures 208, or diagonally adjacent structures 208 of adjacent rows of the structures 208). The linear structures 222 may, for example, be electrically isolated from one another and may electrically connect at least some (e.g., all) structures 208 of individual rows of the structures 208, at least some (e.g., all) structures 208 of individual columns of the structures 208, or at least some (e.g., all) diagonally adjacent structures 208 substantially aligned with one another in an XY-direction. In some embodiments, the linear structures 222 each individually comprise at least one conductive material (e.g., one or more of a metal, a metal alloy, a conductive metal oxide, a conductive metal nitride, a conductive metal silicide, and a conductively doped semiconductor material). For example, if the structures 208 comprise a conductive material, the linear structures 222 may comprise the same conductive material as the structures 208, or may comprise a different conductive material than the structures 208. In some embodiments, the structures 208 and the linear structures 222 comprise substantially the same conductive material. In additional embodiments, one or more the linear structures 222 may comprise a different material, such as a semiconductive material or a dielectric material.

The linear structures 222 may exhibit lateral dimensions, lateral positions, and lateral orientations substantially corresponding to (e.g., substantially the same as) the lateral dimensions, lateral positions, and lateral orientations of the photoexposed regions 218 (FIGS. 7A and 7C) of the patterned photoresist material 214 (FIGS. 7A and 7C). Thus, the linear structures 222 may exhibit maximum widths substantially corresponding to maximum widths (e.g., the widths $W_2$) of the structures 208 associated therewith. Accordingly, depending of the lateral orientations of the linear structures 222, outermost lateral boundaries of the linear structures 222 in the Y-direction (e.g., if the linear structures 222 laterally extend between adjacent structures 208 in the X-direction), the X-direction (e.g., if the linear structures 222 laterally extend between adjacent structures 208 in the Y-direction), or an XY-direction (e.g., if the linear structures 122 laterally extend between adjacent structures 108 laterally diagonally positioned relative to one another) may be substantially coplanar with outermost lateral boundaries in the Y-direction, the X-direction, or the XY-direction of the adjacent structures 208 connected thereto. In addition, the linear structures 222 may be substantially aligned with the adjacent structures 208 connected thereto. For example, as shown in FIG. 10, in some embodiments, individual linear structures 222 are substantially aligned in the Y-direction with adjacent structures 208 of individual rows of the structures 208 extending in the X-direction. In additional embodiments, individual linear structures 222 are substantially aligned in the X-direction with adjacent structures 208 of individual columns of the structures 208 extending in the Y-direction. In further embodiments, individual linear structures 222 are substantially aligned in an XY-direction with adjacent structures 208 laterally diagonally positioned relative to one another.

In embodiments wherein the photoexposed regions 218 (FIGS. 8A and 8B) remain following the development process, a subtractive process may be used to form the linear structures 222. By way of non-limiting example, referring to FIGS. 8A and 8B, if the intervening material 204 is present and comprises a conductive material (e.g., a metal, a metal alloy, a conductive metal oxide, a conductive metal nitride, a conductive metal silicide, a conductively doped semiconductor material), the pattern defined by the remaining photoexposed regions 218 may transferred into the intervening material 204 using at least one anisotropic etching process (e.g., at least one anisotropic dry etching process, such as at least one of reactive ion etching, deep reactive ion etching, plasma etching, reactive ion beam etching, and chemically assisted ion beam etching; at least one anisotropic wet etching process). During the anisotropic etching process, the remaining photoexposed regions 218 and unprotected (e.g., exposed) portions of the intervening material 204 may be simultaneously removed. The etch rate of the photoexposed regions 218 may be less than or equal to the etch rate of the intervening material 204. The anisotropic etching process may substantially (e.g., completely) remove the unprotected (e.g., exposed) portions of the intervening material 204, and the remaining portions of the intervening material 204 following the anisotropic etching process form the linear structures 222 (FIG. 10). The linear structures 222 may exhibit substantially the same lateral dimensions (e.g., lengths, widths) as the photoexposed regions 218. Thereafter, an isolation material (e.g., a dielectric material) may be formed (e.g., deposited) between the linear structures 222, and at least one polishing process (e.g., at least one CMP process) may be employed to remove portions of the photoexposed regions 218 and the isolation material positioned longitudinally above upper surfaces of the linear structures 222.

In embodiments wherein the non-photoexposed regions 216 (FIGS. 9A and 9B) remain following the development process, a damascene process may be used to form the linear structures 222. By way of non-limiting example, referring to FIGS. 9A and 9B, if the intervening material 204 is present and comprises a dielectric material (e.g., a dielectric oxide material, a dielectric nitride material, a dielectric oxynitride material, amphorous carbon, combinations thereof), at least one material removal process (e.g., at least one of a wet etching process and a dry etching process) may be used to transfer the pattern defined by the remaining non-photoexposed regions 216 into the intervening material 204 to form trenches therein. The material removal process may at least partially (e.g., substantially) remove the unprotected (e.g., exposed) portions of the intervening material 204. Thereafter, the trenches may be filled (e.g., through one or more material deposition processes, such as a blanket material deposition process) with a conductive material (e.g., a metal, a metal alloy, a conductive metal oxide, a conductive metal nitride, a conductive metal silicide, a conductively doped semiconductor material), and at least one polishing process (e.g., at least one CMP process) may be used to remove portions of the conductive material, the non-photoexposed regions 216, and the structures 208 positioned longitudinally above upper boundaries of the trenches to form the linear structures 222. The linear structures 222 may exhibit substantially the same lateral dimensions (e.g., lengths, widths) as the photoexposed regions 218 (FIGS. 7A and 7C) of the patterned photoresist material 214 (FIGS. 7A and 7C).

Following the formation of the linear structures 222, the semiconductor device structure 200 may be subjected to additional processing (e.g., additional deposition processes, additional material removal processes), as desired. The additional processing may be conducted by conventional processes and conventional processing equipment, and is not illustrated or described in detail herein.

Thus, in accordance with embodiments of the disclosure, a method of forming a semiconductor device structure comprises forming a preliminary structure comprising a substrate, a photoresist material over the substrate, and structures longitudinally extending from a lower surface of the photoresist material and at least partially into the substrate. The preliminary structure is exposed to electromagnetic radiation directed toward an upper surface of the photoresist material at an angle non-orthogonal to the upper surface to form a patterned photoresist material. At least a portion of the electromagnetic radiation is transmitted through the photoresist material and is reflected off upper surfaces of the structures to transmit the portion of the electromagnetic radiation back through regions of the photoresist material. The patterned photoresist material is developed to selectively remove some regions of the patterned photoresist material relative to other regions of the patterned photoresist material. Linear structures substantially laterally aligned with at least some of the structures are formed using the other regions of the patterned photoresist material.

Figure 11:
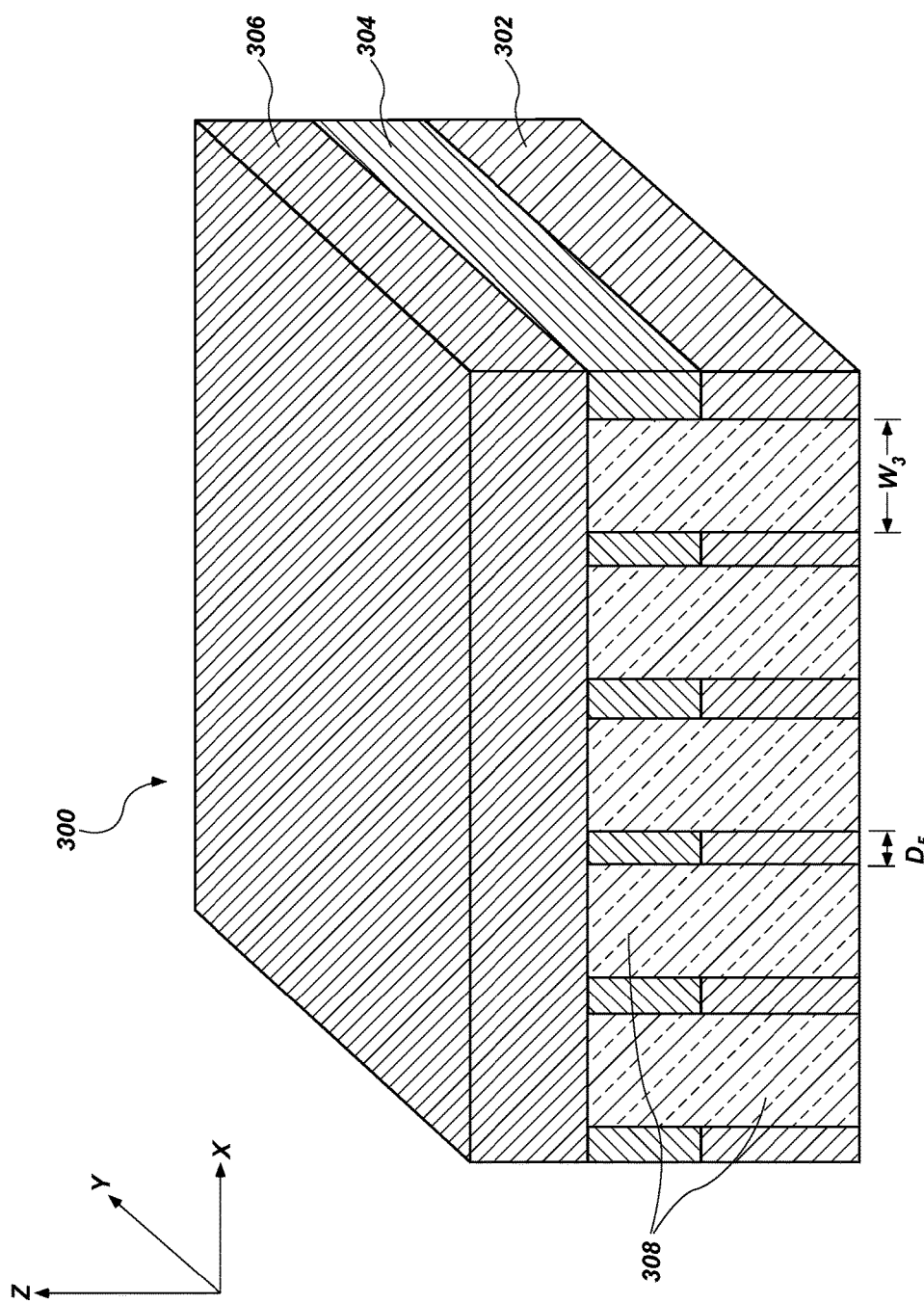
Figure 12A:
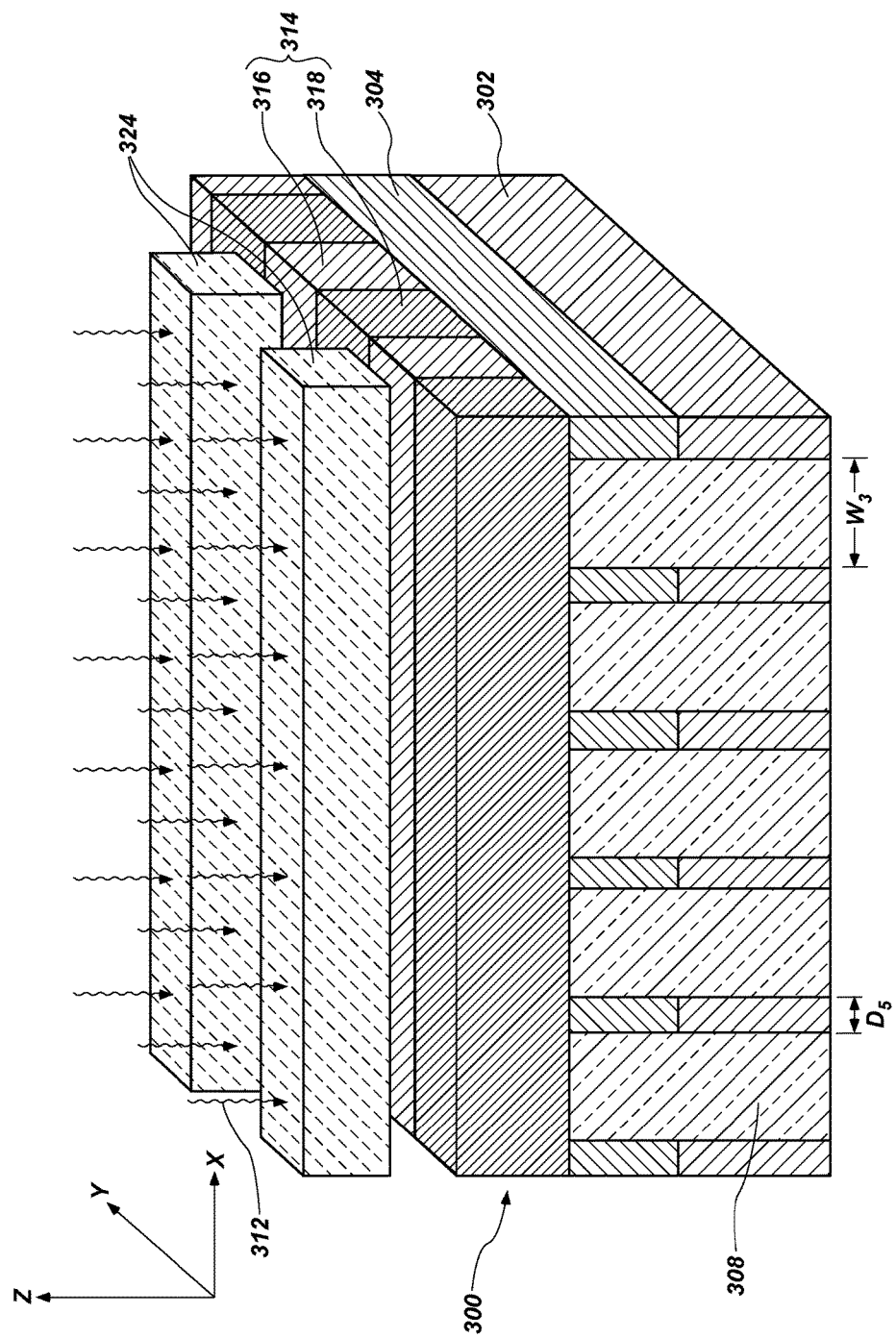
FIGS. 12A and 12B, are perspective, partial cross-sectional (i.e., FIGS. 11, 12A, and 13) and top-down (FIG. 12B) views illustrating another method of forming a semiconductor device structure, in accordance with further embodiments of the disclosure.
Figure 12B:
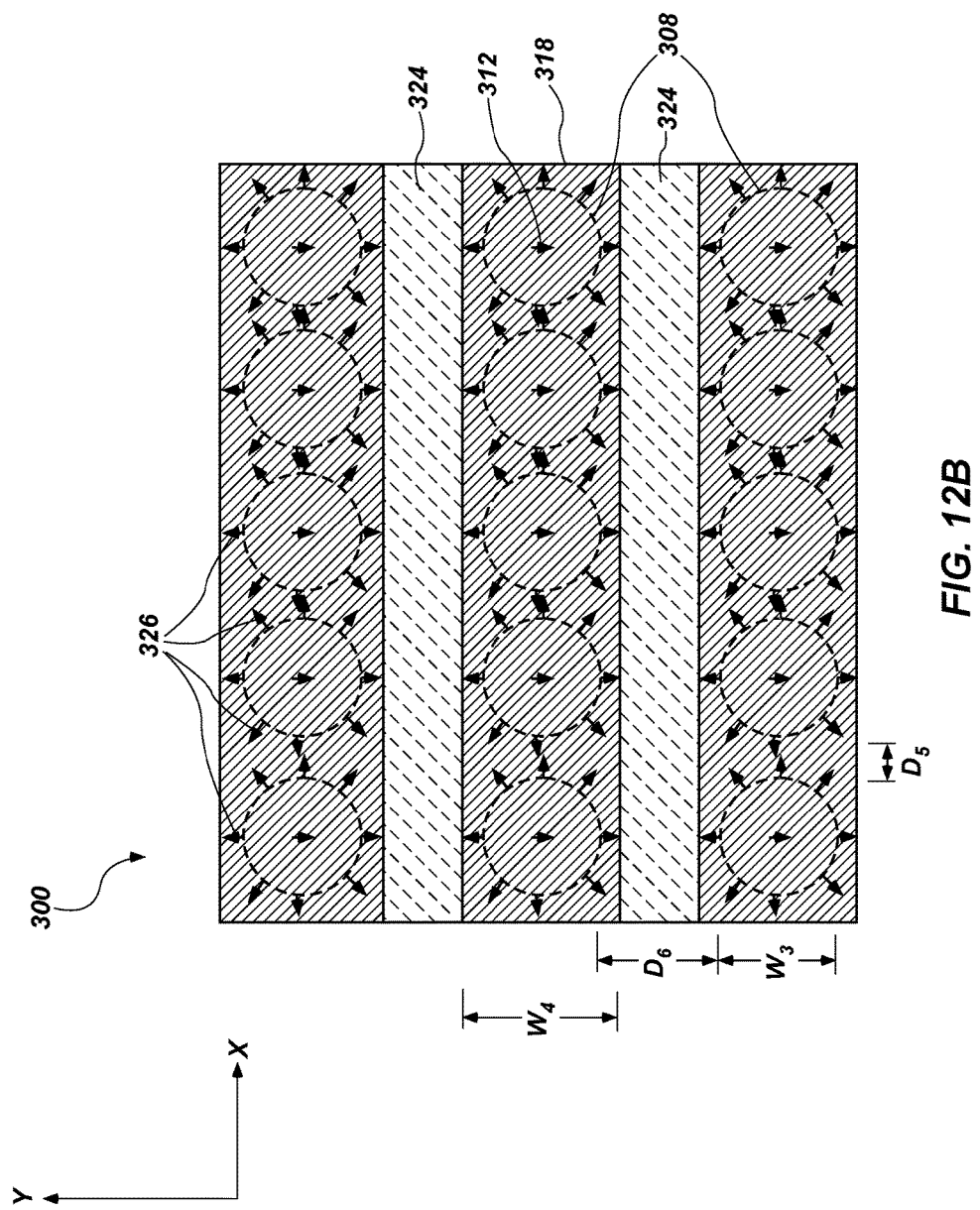
Figure 13:
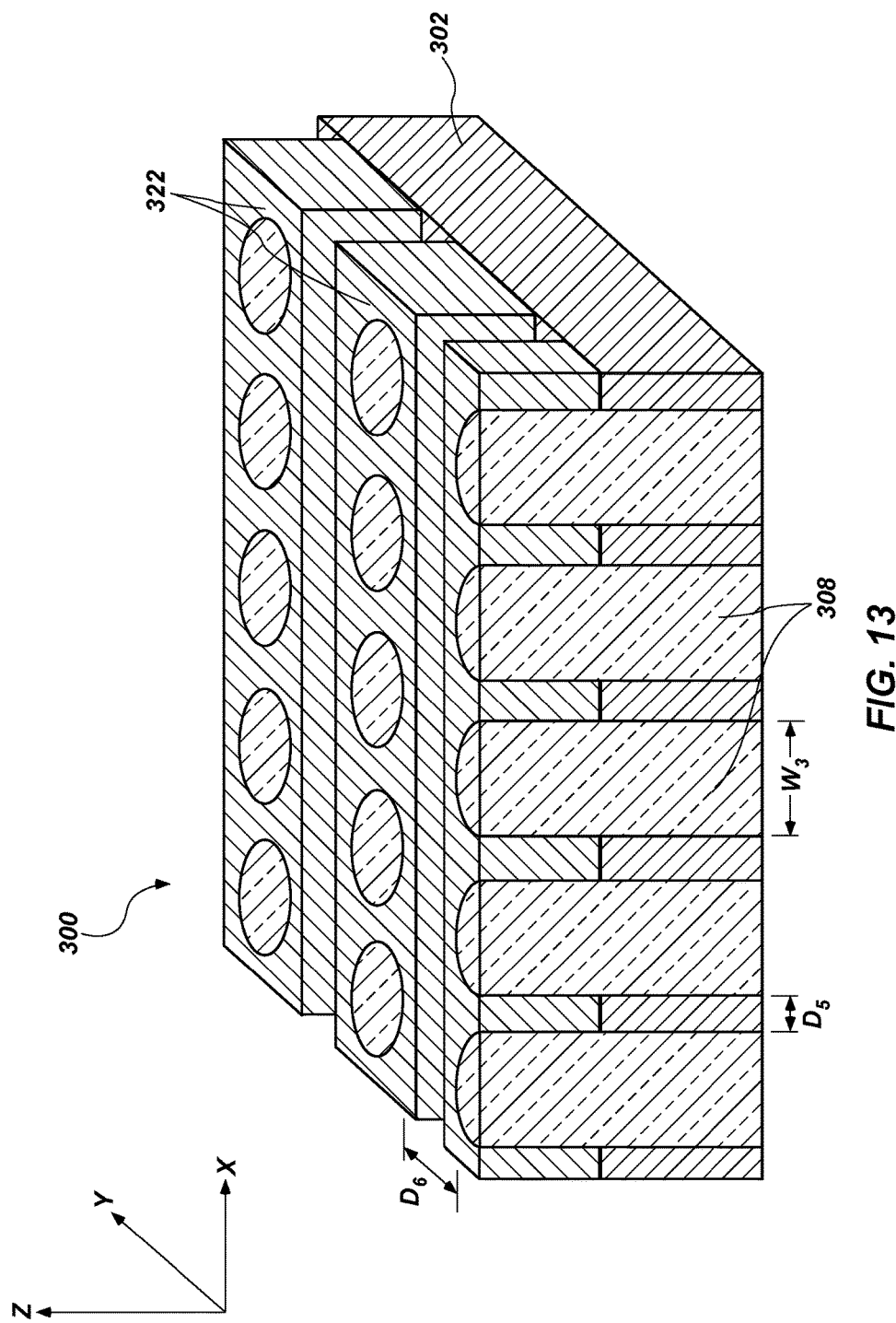

FIGS. 11 through 13, including FIGS. 12A and 12B, are perspective, partial cross-sectional (i.e., FIGS. 11, 12A, and 13), and top-down (i.e., FIG. 12B) views illustrating embodiments of another method of forming a semiconductor device structure, such as a structure of a memory device (e.g., a RAM device, a ROM device, a DRAM device, an SDRAM device, a Flash memory device, a RRAM device, a conductive bridge RAM device, an MRAM device, a PCM memory device, a PCRAM device, an STT-RAM device, an oxygen vacancy-based memory device, a programmable conductor memory device, etc.). With the description provided below, it will be readily apparent to one of ordinary skill in the art that the method described herein may be used in various devices (e.g., photonic devices, electronic devices, electronic-photonic devices, semiconductor devices). In other words, the methods of the disclosure may be used whenever it is desired to form a device including one or more linear structures substantially aligned with other structures.

Referring to FIG. 11, a semiconductor device structure 300 may include a substrate 302, a thermoresist material 306 on or over the substrate 302, and structures 308 (e.g., contact structures, vertical interconnect structures, plug structures) longitudinally extending from a lower boundary (e.g., a lower surface) of the thermoresist material 306 and at least partially (e.g., substantially) into the substrate 302. Optionally, the semiconductor device structure 300 may also include at least one intervening material 304 positioned longitudinally between the substrate 302 and the thermoresist material 306. The intervening material 304 may, for example, be located on an upper surface of the substrate 302, and the thermoresist material 306 may be located on an upper surface of the intervening material 304. If the intervening material 304 is present, the structures 308 may longitudinally extend from an interface of the intervening material 304 and the thermoresist material 306, completely through the intervening material 304, and at least partially (e.g., substantially) into the substrate 302. In additional embodiments, the structures 308 may at least partially longitudinally extend through the thermoresist material 306. By way of non-limiting example, the structures 308 may longitudinally extend completely through each of the thermoresist material 306 and the intervening material 304, and at least partially (e.g., substantially) into the substrate 302. The substrate 302 and the intervening material 304 (if present) may respectively have material compositions substantially similar to the those of the substrate 102 and the intervening material 104 previously described with reference to FIG. 1.

The thermoresist material 306 may be formed of and include a conventional thermoresist, such as a conventional positive tone thermoresist, or a conventional negative tone thermoresist. If the thermoresist material 306 comprises a positive tone thermoresist, the thermoresist material 306 may be formulated such that regions thereof heated to at least a minimum threshold temperature become at least partially soluble in a suitable developer (e.g., a positive tone developer). Thermally exposed regions (e.g., regions heated to the minimum threshold temperature) of the thermoresist material 306 may be at least partially (e.g., substantially) removed by the developer while non-thermally exposed regions (e.g., regions not heated to the minimum threshold temperature) may remain substantially intact (e.g., not substantially removed), as described in further detail below. Alternatively, if the thermoresist material 306 comprises a negative tone thermoresist, the thermoresist material 306 may be formulated such that regions thereof not heated to a minimum threshold temperature are at least partially soluble in a suitable developer (e.g., a negative tone developer). Non-thermally exposed regions of the thermoresist material 306 may be at least partially (e.g., substantially) removed by the developer while thermally exposed regions may remain substantially intact (e.g., not substantially removed), as also described in further detail below. The properties (e.g., tone) of the thermoresist material 306 may be selected relative to material composition of the structure(s) (e.g., the structures 308) and/or material(s) (e.g., intervening material 304, if present) underlying the thermoresist material 306 to facilitate desired patterning of the structure(s) and/or material(s), as described in further detail below. Suitable thermoresist materials (e.g., positive tone thermoresists, negative tone thermoresists) are known in the art, and are, therefore, not described in detail herein. The thermoresist material 306 may exhibit any thickness conducive to the formation of a patterned thermoresist material from the thermoresist material 306 through exposing the thermoresist material 306 and the structures 308 to beams of radiation, as described in further detail below.

The structures 308 may be formed of and include at least one material (e.g. one or more of a conductive material, a dielectric material, and a semiconductive material) that absorbs one or more wavelengths of electromagnetic radiation to which the semiconductor device structure 300 is subsequently exposed to generate and emit thermal radiation. The thermal radiation emitted from the structures 308 patterns the thermoresist material 306. As described in further detail below, the electromagnetic radiation absorption and surface emissivity characteristics of the structures 308 may permit predetermined regions of the thermoresist material 306 to be heated to at least a minimum threshold temperature facilitating desired thermal exposure of the predetermined regions relative to other regions of the thermoresist material 306. In some embodiments, the structures 308 comprise at least one conductive material, such as one or more of a metal, a metal alloy, a conductive metal oxide, a conductive metal nitride, a conductive metal silicide, and a conductively doped semiconductor material. By way of non-limiting example, the structures 308 may comprise one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. A material composition of the structures 308 may be substantially the same as or may be different than a material composition of the intervening material 304 (if present) and/or the substrate 302.

As shown in FIG. 11, upper surfaces of the structures 308 may be substantially coplanar with lower surfaces of the thermoresist material 306 and upper surfaces of the intervening material 304 (if present). Put another way, the thermoresist material 306 may be substantially free of portions of the structures 308 longitudinally extending (e.g., in the Z-direction) at least partially therethrough. In additional embodiments, upper surfaces of the structures 308 may be non-coplanar with lower surfaces of the thermoresist material 306 and upper surfaces of the intervening material 304 (if present). Put another way, the structures 308 may at least partially (e.g., substantially) longitudinally extend (e.g., in the Z-direction) through the thermoresist material 306. Aside from the longitudinal dimensions of the structures 308, the structures 308 each individually exhibit dimensions (e.g., lateral dimensions, such as lengths and widths) and shapes substantially similar to one or more of the dimensions and shapes of the structures 108 previously described with reference to FIG. 1. Each of the structures 308 may exhibit substantially the same dimensions and substantially the same shape as each other of the structures 308, or one or more of the structures 308 may exhibit at least one different dimension and/or a different shape than one or more other of the structures 308. As shown in FIG. 11, in some embodiments, each of the structures 308 exhibits a width $W_3$ (e.g., diameter) and a cylindrical column shape including a substantially circular lateral cross-sectional geometry.

The alignment of the structures 308 may be substantially similar to the alignment of the structures 108 previously described with reference to FIG. 1. As shown in FIG. 11, in some embodiments, the semiconductor device structure 300 includes rows of the structures 308 extending in an X-direction and columns of the structures 308 extending in a Y-direction substantially perpendicular to the X-direction. The structures 308 within each row may be substantially aligned with one another, and the structures 308 within each column may also be substantially aligned with one another. In additional embodiments, at least partially depending on a desired configuration of a patterned thermoresist material to be formed using the structures 308, at least some adjacent structures 308 most proximate one another in the X-direction may be unaligned with (e.g., offset from) one another in the Y-direction, and/or at least some adjacent structures 308 most proximate one another in the Y-direction may be unaligned with (e.g., offset from) one another in the X-direction.

The structures 308 may exhibit any desired spacing relative to one another facilitating the formation of a patterned thermoresist material exhibiting desired feature dimensions, shapes, and spacing by exposing the semiconductor device structure 300 to beams of electromagnetic radiation (e.g., beams of IR radiation), as described in further detail below. As shown in FIG. 11, adjacent structures 308 within each row of the structures 308 may be substantially uniformly (e.g., substantially regularly) spaced apart from one another by a first distance $D_5$, and adjacent structures 308 within each column of the structures 308 may be substantially uniformly (e.g., substantially regularly) spaced apart from one another by a second distance $D_6$. The first distance $D_5$ may be substantially the same as the second distance $D_6$, or the first distance $D_5$ may be different than the second distance $D_6$. Accordingly, a pitch between centers of adjacent structures 308 within each of the rows may be substantially constant (e.g., non-variable), and a pitch between centers of adjacent structures 308 within each of the columns may also be substantially constant (e.g., non-variable). In additional embodiments, at least some adjacent structures 308 within at least one row of the structures 308 are spaced apart from one another by a different distance than at least some other adjacent structures 308 within the row, and/or at least some adjacent structures 308 within at least one column of the structures 308 are spaced apart from one another by a different distance than at least some other adjacent structures 308 within the column. Accordingly, a pitch between centers of at least some adjacent structures 308 within at least one row may be different than a pitch between centers of at least some other adjacent structures 308 within the row, and/or a pitch between centers of at least some adjacent structures 308 within at least one column may be different than a pitch between centers of at least some other adjacent structures 308 within the column.

Each of the substrate 302, the intervening material 304 (if present), the thermoresist material 306, and the structures 308 may be formed using conventional processes including, conventional material deposition processes (e.g., conventional PVD processes, such as sputtering, evaporation, or ionized PVD; conventional CVD processes; conventional ALD processes; conventional spin-coating processes), conventional photolithography processes, and conventional material removal processes (e.g., conventional etching processes, such as conventional dry etching processes and conventional wet etching processes; conventional polishing processes, such as conventional CMP processes). Such processes are known in the art and, therefore, are not described in detail herein.

Referring next to FIG. 12A, the semiconductor device structure 300 is selectively exposed to beams (e.g., rays, waves) of electromagnetic radiation 312 directed through at least one mask 324 from one or more radiation sources to form a patterned thermoresist material 314 including non-thermally exposed regions 316 and thermally exposed regions 318. FIG. 12B is a top-down view of the semiconductor device structure 300 at the processing stage depicted in FIG. 12A, wherein lateral boundaries of the structures 308 underlying the patterned thermoresist material 314 and the mask 324 are depicted with dashed lines.

Depending at least on the tone (e.g., positive tone, or negative tone) of the thermoresist material 306 (FIG. 11), the non-thermally exposed regions 316 of the patterned thermoresist material 314 comprise regions of the patterned thermoresist material 314 not heated to at least a minimum threshold temperature to facilitate either the substantially complete removal of the regions upon subsequent development (e.g., if the thermoresist material 306 comprises a positive tone thermoresist material and the developer employed in the subsequent development comprises positive tone developer) or the at least partial (e.g., substantial) maintenance (e.g., preservation, non-removal) of the regions upon subsequent development (e.g., if the thermoresist material 306 comprises a negative tone thermoresist material and the developer employed in the subsequent development comprises negative tone developer). Accordingly, the thermally exposed regions 318 of the patterned thermoresist material 314 comprise additional regions of the patterned thermoresist material 314 heated to at least a minimum threshold temperature to facilitate either the substantially complete removal of the additional regions upon subsequent development or the at least partial (e.g., substantial) maintenance of the additional regions upon subsequent development. Whether the non-thermally exposed regions 316 comprise regions of the patterned thermoresist material 314 to be substantially removed through subsequent development or comprise regions of the patterned thermoresist material 314 to be substantially maintained through subsequent development may at least partially depend on the material composition of the intervening material 304 (if present) to facilitate desired patterning of the intervening material 304 through one or more subsequent processes (e.g., one or more subsequent subtractive processes, or one or more subsequent damascene processes), as described in further detail below.

The mask 324 may comprise a conventional mask exhibiting a desired pattern to be transferred to the thermoresist material 306 (FIG. 11). The mask 324 may, for example, include features (e.g., apertures, regions) having lateral dimensions, shapes, positions, and orientations facilitating desired lateral dimensions, shapes, positions, and orientations of the non-thermally exposed regions 316 and thermally exposed regions 318 of the patterned thermoresist material 314. As shown in FIGS. 12A and 12B, in some embodiments, the mask 324 includes apertures sized, shaped, oriented, and positioned to expose at least some (e.g., all) adjacent structures 308 of individual rows of the structures 308 extending in the X-direction to the beams of electromagnetic radiation 312 transmitted therethrough. In additional embodiments, the mask 324 includes apertures sized, shaped, oriented, and positioned to expose at least some (e.g., all) adjacent structures 308 of individual columns of the structures 308 extending in the Y-direction to the beams of electromagnetic radiation 312 transmitted therethrough. In further embodiments, the mask 324 includes apertures sized, shaped, oriented, and positioned to expose at least some (e.g., all) diagonally adjacent structures 108 substantially aligned with one another in an XY-direction to the beams of electromagnetic radiation 312 transmitted therethrough. The mask 324 having the desired pattern may be formed and positioned by conventional processes, which are not described in detail herein.

Referring to FIG. 12B, as the beams of electromagnetic radiation 312 exiting the mask 324 are transmitted through the thermoresist material 306 (FIG. 11), a portion of the beams of electromagnetic radiation 312 are absorbed by and heat the structures 308. Thermal radiation 326 is then isotropically emitted from surfaces of the structures 308 into portions of the thermoresist material 306 adjacent thereto to selectively heat the portions of the thermoresist material 306. The thermal radiation 326 isotropically emitted from the surfaces of the structures 308 enhances thermal exposure within the portions of thermoresist material 306 relative to other portions of the thermoresist material 306 and forms the patterned thermoresist material 314 including the thermally exposed regions 318 (i.e., corresponding to the portions of the thermoresist material 306 receiving the thermal radiation 326 from the structures 308) and the non-thermally exposed regions 316 (i.e., corresponding to the other portions of the thermoresist material 306 that do not receive the thermal radiation 326 from the structures 308). The thermal radiation 326 isotropically emitted from the structures 308 heats the portions of the thermoresist material 306 adjacent thereto to at least the minimum threshold temperature permitting the thermally exposed regions 318 of the patterned thermoresist material 314 to have a different solubility in a developer (e.g., a positive tone develop, a negative tone developer) than the non-thermally exposed regions 316 of the patterned thermoresist material 314 during subsequent development of the patterned thermoresist material 314.

With continued reference to FIG. 12B, as the thermal radiation 326 is isotropically emitted from the structures 308 at least some paths of the thermal radiation 326 emitted by adjacent structures 308 (e.g., adjacent structures 308 of individual rows of the structures 308, or adjacent structures of individual columns of the structures) intersect with one another. The intersecting paths of the emitted thermal radiation 326 (and, hence, thermal exposure) may permit the thermally exposed regions 318 of the patterned thermoresist material 314 to be substantially aligned with and continuously laterally extend between the adjacent structures 308.

The semiconductor device structure 300, including the thermoresist material 306 and the structures 308, may be exposed to any wavelength(s) of electromagnetic radiation (e.g., UV radiation, IR radiation, visible radiation) from the radiation sources that can be substantially transmitted through the thermoresist material 306, and that can be at least partially (e.g., substantially) absorbed by the structures 308 exposed thereto to generate and emit the thermal radiation 326. By way of non-limiting example, the beams of electromagnetic radiation 312 may each individually have a wavelength within the IR spectrum, such as a wavelength within a range of from about 700 nm to about 1 mm. In addition, the semiconductor device structure 300 may be exposed to a single (e.g., only one) dose of electromagnetic radiation, or may be exposed to multiple (e.g., more than one) doses of electromagnetic radiation. If multiple doses of electromagnetic radiation are utilized, each of the multiple doses of electromagnetic radiation may be substantially the same (e.g., substantially the same radiation wavelength(s) and duration), or at least one of the multiple doses of electromagnetic radiation may be different than (e.g., different radiation wavelength(s) and/or different durations) at least one other of the multiple doses of electromagnetic radiation.

Depending on the configurations and positions of the mask 324 and the structures 308, the non-thermally exposed regions 316 and thermally exposed regions 318 of the patterned thermoresist material 314 may extend in substantially the same lateral direction (e.g., in the X-direction; in the Y-direction; in an XY-direction angled relative to the X-direction and the Y-direction, such as a lateral direction oriented at an angle between 0 degree and 90 degrees relative to one or more of the X-direction and the Y-direction, a lateral direction oriented at an angle within a range of from about 10 degrees and to about 80 degrees relative to one or more of the X-direction and the Y-direction, a lateral direction oriented at an angle within a range of from about 30 degrees and to about 60 degrees relative to one or more of the X-direction and the Y-direction, or a lateral direction oriented at an angle of about 45 degrees relative to each of the X-direction and the Y-direction). In addition, the non-thermally exposed regions 316 may laterally intervene (e.g., in the Y-direction if the non-thermally exposed regions 316 and the thermally exposed regions 318 extend in the X-direction; in the X-direction if the non-thermally exposed regions 316 and the thermally exposed regions 318 extend in the Y-direction; in an additional XY-direction extending perpendicular to an XY-direction if the non-thermally exposed regions 316 and the thermally exposed regions 318 extend in the XY-direction) between the thermally exposed regions 318. As shown in FIG. 12B, in some embodiments, the thermally exposed regions 318 are substantially laterally aligned (in the Y-direction) with rows of the structures 308 extending in the X-direction, and the non-thermally exposed regions 316 are laterally offset (in the Y-direction) from the rows of the structures 308. The thermally exposed regions 318 may laterally extend in parallel with one another and the non-thermally exposed regions 316 in the X-direction, and may laterally alternate with the non-thermally exposed regions 316 in the Y-direction. In additional embodiments, the thermally exposed regions 318 are substantially laterally aligned (in the X-direction) with columns of the structures 308 extending in the Y-direction, and the non-thermally exposed regions 316 are laterally offset (in the X-direction) from the columns of the structures 308. The thermally exposed regions 318 may laterally extend in parallel with one another and the non-thermally exposed regions 316 in the Y-direction, and may laterally alternate with the non-thermally exposed regions 316 in the X-direction. In further embodiments, the thermally exposed regions 318 are substantially laterally aligned (in an XY-direction) with adjacent structures 308 laterally diagonally positioned relative to one another. The thermally exposed regions 318 may laterally extend in parallel with one another and the non-thermally exposed regions 316 in an XY-direction, and may laterally alternate with the non-thermally exposed regions 316 in an additional XY-direction oriented perpendicular to the XY-direction.

As shown in FIGS. 12A and 12B, the thermally exposed regions 318 of the patterned thermoresist material 314 may longitudinally overly (e.g., in the Z-direction) and laterally extend substantially continuously between adjacent structures 308 (e.g., adjacent structures 308 of individual rows of the structures 308 if the thermally exposed regions 318 laterally extend in the X-direction, adjacent structures 308 individual columns of the structures 308 if the thermally exposed regions 318 laterally extend in the Y-direction, diagonally adjacent structures 308 if the thermally exposed regions 318 laterally extend in an XY-direction). For example, the thermally exposed regions 318 of the patterned thermoresist material 314 may directly contact and extend continuously between of adjacent structures 308 of individual rows of the structures 308, adjacent structures 308 of individual columns of the structures 308, or diagonally adjacent structures 308 of adjacent rows of the structures 308 or of adjacent columns of the structures 308. The thermally exposed regions 318 of the patterned thermoresist material 314 may laterally extend substantially continuously across the patterned thermoresist material 314 in the same direction as individual rows of the structures 308 thereunder, in the same direction as individual columns of the structures 308 thereunder, or in the same direction as diagonally adjacent structures 308 thereunder. Accordingly, at least in embodiments wherein the structures 308 are formed of and include a conductive material, the thermally exposed regions 318 may facilitate the subsequent formation of conductive linear structures extending substantially continuously between and electrically connecting at least some (e.g., all) structures 308 of individual rows of the structures 308, at least some (e.g., all) structures 308 of individual columns of the structures 308, or at least some (e.g., all) diagonally adjacent structures 308 substantially aligned with one another in an XY-direction, as described in further detail below. In addition, the non-thermally exposed regions 316 of the patterned thermoresist material 314 may laterally extend substantially continuously across the patterned thermoresist material 314 in the same direction (e.g., the X-direction, the Y-direction, and XY-direction) as the thermally exposed regions 318.

Referring to FIG. 12B, in some embodiments, the thermally exposed regions 318 of the patterned thermoresist material 314 exhibit widths $W_4$ greater than the widths $W_3$ of the structures 308 associated therewith (e.g., laterally aligned with and longitudinally underlying the thermally exposed regions 318). For example, if the thermally exposed regions 318 are formed to laterally extend in the X-direction, the maximum lateral dimensions (e.g., the widths $W_4$) in the Y-direction of the thermally exposed regions 318 may be greater than the maximum lateral dimensions (e.g., the widths $W_3$) in the Y-direction of the structures 308 associated therewith. As another example, if the thermally exposed regions 318 are formed to laterally extend in the Y-direction, the maximum lateral dimensions (e.g., the widths $W_4$) in the X-direction of the thermally exposed regions 318 may be greater than the maximum lateral dimensions (e.g., the widths $W_3$) in the X-direction of the structures 308 associated therewith (e.g., laterally aligned with and longitudinally underlying the thermally exposed regions 318). As a further example, if the thermally exposed regions 318 are formed to laterally extend in an XY-direction, the maximum lateral dimensions (e.g., widths) in an additional XY-direction perpendicular to the XY-direction may be greater than the maximum lateral dimensions in the additional XY-direction of the structures 308 associated therewith. In additional embodiments, the widths $W_4$ of the thermally exposed regions 318 of the patterned thermoresist material 314 are substantially the same as the widths $W_3$ of the structures 308 associated therewith. Outermost lateral boundaries in the X-direction, the Y-direction, or an XY-direction of each of the thermally exposed regions 318 may be substantially coplanar with outermost lateral boundaries in the X-direction, the Y-direction, or the XY-direction of each of the structures 308 associated therewith. The thermally exposed regions 318 may be formed to exhibit desired widths $W_4$ by controlling the configuration and position of the mask 324 (including the dimensions and positions of the features thereof) relative to the configurations and positions of at least the structures 308 and the thermoresist material 306 (FIG. 11) and the properties of the beams of electromagnetic radiation 312 emitted from the radiation sources. Each of the thermally exposed regions 318 may exhibit substantially the same maximum width (e.g., substantially the same width $W_4$), or at least one of the thermally exposed regions 318 may exhibit a different maximum width than at least one other of the thermally exposed regions 318.

Following the formation of the patterned thermoresist material 314 including the non-thermally exposed regions 316 and the thermally exposed regions 318, the patterned thermoresist material 314 is subjected to at least one development process to selectively remove the thermally exposed regions 318 relative to the non-thermally exposed regions 316, or to selectively remove the non-thermally exposed regions 316 relative to the thermally exposed regions 318. Which of the non-thermally exposed regions 316 and the thermally exposed regions 318 is removed by the development process is selected at least partially based on the properties (e.g., material composition) of the structure(s) (e.g., the structures 308) and/or material(s) (e.g., the intervening material 304, if present) underlying (e.g., directly underlying) the patterned thermoresist material 314, and on predetermined processes (e.g., damascene processes, subtractive processes) of forming linear structures (e.g., conductive linear structures) substantially aligned with and connected to (e.g., electrically connected to, physically connected to) at least some adjacent structures 308 (e.g., adjacent structures 308 of rows of the structures 308 extending in the X-direction, adjacent structures 308 of columns of the structures 308 extending in the Y-direction, diagonally adjacent structures 308 of adjacent rows of the structures 308 or of adjacent columns of the structures 308) based on the properties of the structure(s) and/or material(s) underlying the patterned thermoresist material 314, as described in further detail below.

In some embodiments, the development process substantially removes the non-thermally exposed regions 316 of the patterned thermoresist material 314, while at least partially (e.g., substantially) maintaining (e.g., keeping, preserving) the thermally exposed regions 318. For example, if the patterned thermoresist material 314 comprises a negative tone resist, the development process may include developing the patterned thermoresist material 314 with a negative tone developer to selectively remove the non-thermally exposed regions 316 relative to the thermally exposed regions 318. Selectively removing the non-thermally exposed regions 316 of the patterned thermoresist material 314 relative to the thermally exposed regions 318 may, for example, be performed when the material composition(s) of the structure(s) (e.g., the structures 308) and/or material(s) (e.g., the intervening material 304, if present) underlying (e.g., directly underlying) the patterned thermoresist material 314 facilitate the subsequent formation of linear structures (e.g., conductive linear structures) through at least one subtractive process, as described in further detail below.

In additional embodiments, the development process substantially removes the thermally exposed regions 318 of the patterned thermoresist material 314, while at least partially (e.g., substantially) maintaining (e.g., keeping, preserving) the non-thermally exposed regions 316. For example, if the patterned thermoresist material 314 comprises a positive tone resist, the development process may include developing the patterned thermoresist material 314 with a positive tone developer to selectively remove the thermally exposed regions 318 relative to the non-thermally exposed regions 316. Selectively removing the thermally exposed regions 318 of the patterned thermoresist material 314 relative to the non-thermally exposed regions 316 may, for example, be performed when the material composition(s) of the structure (s) (e.g., the structures 308) and/or material(s) (e.g., the intervening material 304, if present) underlying (e.g., directly underlying) the patterned thermoresist material 314 facilitate the subsequent formation of linear structures (e.g., conductive linear structures) through at least one damascene process, as described in further detail below.

Referring next to FIG. 13, following the removal of the non-thermally exposed regions 316 (FIGS. 12A and 12B) or the thermally exposed regions 318 (FIGS. 12A and 12B), the remaining thermally exposed regions 318 or the remaining non-thermally exposed regions 316 may be used to form linear structures 322 (e.g., line structures, linear routing structures) substantially aligned with, contacting (e.g., physically contacting, electrically contacting), and laterally extending between (e.g., in the X-direction, in the Y-direction, in an XY-direction) at least some adjacent structures 308 (e.g., adjacent structures 308 of rows of the structures 308; adjacent structures 308 of columns of the structures 308; adjacent structures 308 diagonally laterally positioned relative to one another, such as diagonally adjacent structures 308 of adjacent columns of the structures 308, or diagonally adjacent structures 308 of adjacent rows of the structures 308). The linear structures 322 may, for example, be electrically isolated from one another and may electrically connect at least some (e.g., all) structures 308 of individual rows of the structures 308, at least some (e.g., all) structures 308 of individual columns of the structures 308, or at least some (e.g., all) diagonally adjacent structures 308 substantially aligned with one another in an XY-direction. In some embodiments, the linear structures 322 each individually comprise at least one conductive material (e.g., one or more of a metal, a metal alloy, a conductive metal oxide, a conductive metal nitride, a conductive metal silicide, and a conductively doped semiconductor material). For example, if the structures 308 comprise a conductive material, the linear structures 322 may comprise the same conductive material as the structures 308, or may comprise a different conductive material than the structures 308. In some embodiments, the structures 308 and the linear structures 322 comprise substantially the same conductive material. In additional embodiments, one or more the linear structures 322 may comprise a different material, such as a semiconductive material or a dielectric material.

The linear structures 322 may exhibit lateral dimensions, lateral positions, and lateral orientations substantially corresponding to (e.g., substantially the same as) the lateral dimensions, lateral positions, and lateral orientations of the thermally exposed regions 318 (FIGS. 12A and 12B) of the patterned thermoresist material 314 (FIGS. 12A and 12B). In addition, the linear structures 322 may be substantially aligned with the adjacent structures 308 connected thereto. For example, as shown in FIG. 13, in some embodiments, individual linear structures 322 are substantially aligned in the Y-direction with adjacent structures 308 of individual rows of the structures 308 extending in the X-direction. In additional embodiments, individual linear structures 322 are substantially aligned in the X-direction with adjacent structures 308 of individual columns of the structures 308 extending in the Y-direction. In further embodiments, individual linear structures 322 are substantially aligned in an XY-direction with adjacent structures 308 laterally diagonally positioned relative to one another.

In embodiments wherein the thermally exposed regions 318 (FIGS. 12A and 12B) remain following the development process, a subtractive process may be used to form the linear structures 322. By way of non-limiting example, if the intervening material 304 is present and comprises a conductive material (e.g., a metal, a metal alloy, a conductive metal oxide, a conductive metal nitride, a conductive metal silicide, a conductively doped semiconductor material), the pattern defined by the remaining thermally exposed regions 318 may transferred into the intervening material 304 using at least one anisotropic etching process (e.g., at least one anisotropic dry etching process, such as at least one of reactive ion etching, deep reactive ion etching, plasma etching, reactive ion beam etching, and chemically assisted ion beam etching; at least one anisotropic wet etching process). During the anisotropic etching process, the remaining thermally exposed regions 318 and unprotected (e.g., exposed) portions of the intervening material 304 may be simultaneously removed. The etch rate of the thermally exposed regions 318 may be less than or equal to the etch rate of the intervening material 304. The anisotropic etching process may substantially (e.g., completely) remove the unprotected (e.g., exposed) portions of the intervening material 304, and the remaining portions of the intervening material 304 following the anisotropic etching process form the linear structures 322. The linear structures 322 may exhibit substantially the same lateral dimensions (e.g., lengths, widths) as the thermally exposed regions 318 of the patterned thermoresist material 314 (FIGS. 12A and 12B). Thereafter, an isolation material (e.g., a dielectric material) may be formed (e.g., deposited) between the linear structures 322, and at least one polishing process (e.g., at least one CMP process) may be employed to remove portions of the thermally exposed regions 318 and the isolation material positioned longitudinally above upper surfaces of the linear structures 322.

In embodiments wherein the non-thermally exposed regions 316 (FIGS. 12A and 12B) remain following the development process, a damascene process may be used to form the linear structures 322. By way of non-limiting example, if the intervening material 304 is present and comprises a dielectric material (e.g., a dielectric oxide material, a dielectric nitride material, a dielectric oxynitride material, amphorous carbon, combinations thereof), at least one material removal process (e.g., at least one of a wet etching process and a dry etching process) may be used to transfer the pattern defined by the remaining non-thermally exposed regions 316 into the intervening material 304 to form trenches therein. The material removal process may at least partially (e.g., substantially) remove the unprotected (e.g., exposed) portions of the intervening material 304. Thereafter, the trenches may be filled (e.g., through one or more material deposition processes, such as a blanket material deposition process) with a conductive material (e.g., a metal, a metal alloy, a conductive metal oxide, a conductive metal nitride, a conductive metal silicide, a conductively doped semiconductor material), and at least one polishing process (e.g., at least one CMP process) may be used to remove portions of the conductive material, the non-thermally exposed regions 316, and the structures 308 positioned longitudinally above upper boundaries of the trenches to form the linear structures 322. The linear structures 322 may exhibit substantially the same lateral dimensions (e.g., lengths, widths) as the thermally exposed regions 318 of the patterned thermoresist material 314 (FIGS. 12A and 12B).

Following the formation of the linear structures 322, the semiconductor device structure 300 may be subjected to additional processing (e.g., additional deposition processes, additional material removal processes), as desired. The additional processing may be conducted by conventional processes and conventional processing equipment, and is not illustrated or described in detail herein.

Thus, in accordance with embodiments of the disclosure, a method of forming a semiconductor device structure comprises forming a preliminary structure comprising a substrate, a thermoresist material over the substrate, and structures longitudinally extending from a lower surface of the thermoresist material and at least partially into the substrate. The preliminary structure is exposed to electromagnetic radiation through a mask to form a patterned thermoresist material. At least a portion of the electromagnetic radiation is transmitted through the thermoresist material and is absorbed by a portion of the structures to produce heat that is then emitted from the portion of the structures into regions of the thermoresist material adjacent thereto. The patterned thermoresist material is developed to selectively remove some regions of the patterned thermoresist material relative to other regions of the patterned thermoresist material. Linear structures substantially laterally aligned with at least some of the structures are formed using the other regions of the patterned thermoresist material.

The methods of the disclosure facilitate the simple, efficient, and cost-effective formation of a variety of semiconductor device structures, such as memory device structures. The methods facilitate self-alignment of linear structures (e.g., the linear structures 122, 222, 322) with multiple other structures (e.g., the structures 108, 208, 308), and may avoid or relax overlay constraints as compared to conventional methods of forming similar line-structures over similar non-linear structures. The methods of the disclosure may reduce the number of processing acts (e.g., alignment and masking acts), materials, and structures required to form the semiconductor device structures as compared to conventional methods of forming the semiconductor device structures, and may facilitate improved pattern quality, lower costs, greater packaging density, and increased miniaturization of components as compared to conventional methods. Semiconductor device structures formed by the methods of the disclosure may exhibit feature dimensions at least equivalent to those of semiconductor device structures formed by conventional methods.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A method of forming a semiconductor device structure, comprising:
　forming a preliminary structure comprising a substrate, a photoresist material over the substrate, and a plurality of structures longitudinally extending through the photoresist material;
　exposing the preliminary structure to electromagnetic radiation directed toward upper surfaces of the photoresist material and the plurality of structures at an angle non-orthogonal to the upper surfaces to form a patterned photoresist material;
　developing the patterned photoresist material to selectively remove some regions of the patterned photoresist material relative to other regions of the patterned photoresist material; and
　forming linear structures substantially laterally aligned with at least some structures of the plurality of structures using the other regions of the patterned photoresist material.

2. The method of claim 1, wherein exposing the preliminary structure to electromagnetic radiation directed toward upper surfaces of the photoresist material and the plurality of structures at an angle non-orthogonal to the upper surfaces comprises selecting the angle relative to a thickness of the photoresist material and a distance between adjacent structures of the plurality of structures to form at least one penumbra laterally extending completely between lateral boundaries of the adjacent structures.

3. The method of claim 2, wherein selecting the angle relative to a thickness of the photoresist material and a distance between adjacent structures of the plurality of structures to form at least one penumbra laterally extending completely between lateral boundaries of the adjacent structures comprises forming the at least one penumbra to exhibit lateral boundaries substantially aligned with coplanar lateral boundaries of the adjacent structures.

4. The method of claim 1, wherein exposing the preliminary structure to electromagnetic radiation directed toward upper surfaces of the photoresist material and the plurality of structures at an angle non-orthogonal to the upper surfaces comprises selecting the angle relative to a thickness of the photoresist material and one or more distances between adjacent structures of the plurality of structures to form overlapping penumbras laterally extending between and substantially aligned with at least three laterally aligned structures of the plurality of structures.

5. The method of claim 1, wherein exposing the preliminary structure to electromagnetic radiation directed toward upper surfaces of the photoresist material and the plurality of structures at an angle non-orthogonal to the upper surfaces to form a patterned photoresist material comprises forming the patterned photoresist material to comprise non-photoexposed regions and photoexposed regions laterally intervening between the non-photoexposed regions, the non-photoexposed regions substantially laterally aligned with and extending across rows of the plurality of structures or columns of the plurality of structures.

6. The method of claim 5, wherein:
developing the patterned photoresist material to selectively remove some regions of the patterned photoresist material relative to other regions of the patterned photoresist material comprises selectively removing one of the non-photoexposed regions and the photoexposed regions relative to the other of the non-photoexposed regions and the photoexposed regions; and
forming linear structures substantially laterally aligned with at least some structures of the plurality of structures using the other regions of the patterned photoresist material comprises forming the linear structures to be substantially laterally aligned with and extend across the rows of the plurality of structures or the columns of the plurality of structures using the non-photoexposed regions or the photoexposed regions of the patterned photoresist material remaining after the development of the patterned photoresist material.

7. The method of claim 6, wherein the preliminary structure further comprises a conductive material positioned longitudinally between the substrate and the photoresist material, and wherein:
developing the patterned photoresist material to selectively remove some regions of the patterned photoresist material relative to other regions of the patterned photoresist material comprises selectively removing the photoexposed regions relative to the non-photoexposed regions; and
forming linear structures substantially laterally aligned with at least some structures of the plurality of structures using the other regions of the patterned photoresist material comprises substantially removing portions of the conductive material not covered by the non-photoexposed regions.

8. The method of claim 6, wherein the preliminary structure further comprises a dielectric material positioned longitudinally between the substrate and the photoresist material, and wherein:
developing the patterned photoresist material to selectively remove some regions of the patterned photoresist material relative to other regions of the patterned photoresist material comprises selectively removing the non-photoexposed regions relative to the photoexposed regions; and
forming linear structures substantially laterally aligned with at least some structures of the plurality of structures using the other regions of the patterned photoresist material comprises:
removing portions of the dielectric material not covered by the photoexposed regions to form trenches at least partially extending through the dielectric material; and
filling the trenches with a conductive material.

9. A method of forming a semiconductor device structure, comprising:
forming a preliminary structure comprising a substrate, a photoresist material over the substrate, and structures longitudinally extending downward from a lower surface of the photoresist material;
exposing the preliminary structure to electromagnetic radiation directed toward an upper surface of the photoresist material at an angle non-orthogonal to the upper surface to form a patterned photoresist material, a portion of the electromagnetic radiation transmitted through the photoresist material and reflected off upper surfaces of the structures to transmit the portion of the electromagnetic radiation back through regions of the photoresist material;
developing the patterned photoresist material to selectively remove some regions of the patterned photoresist material relative to other regions of the patterned photoresist material; and
forming linear structures substantially laterally aligned with at least some of the structures using the other regions of the patterned photoresist material.

10. The method of claim 9, wherein exposing the preliminary structure to electromagnetic radiation directed toward an upper surface of the photoresist material at an angle non-orthogonal to the upper surface comprises selecting the angle to facilitate intersections between paths of the electromagnetic radiation through the regions of the photoresist material and paths of the portion of the electromagnetic radiation reflected back through the regions of the photoresist material.

11. The method of claim 9, wherein exposing the preliminary structure to electromagnetic radiation directed toward an upper surface of the photoresist material at an angle non-orthogonal to the upper surface comprises selecting the angle to be between 0 degrees and 90 degrees.

12. The method of claim 9, wherein a forming a preliminary structure comprises forming the preliminary structure to further comprise an intervening material longitudinally between the substrate and the photoresist material, an upper surface of the intervening material substantially coplanar with upper surfaces of the structures.

13. The method of claim 9, wherein exposing the preliminary structure to electromagnetic radiation directed toward an upper surface of the photoresist material at an angle non-orthogonal to the upper surface to form a patterned photoresist material comprises forming the patterned photoresist material to comprise photoexposed regions and non-photoexposed regions laterally intervening between the photoexposed regions, the photoexposed regions substantially laterally aligned with and extending across rows of the structures or columns of the structures.

14. The method of claim 13, wherein:
    developing the patterned photoresist material to selectively remove some regions of the patterned photoresist material relative to other regions of the patterned photoresist material comprises selectively removing one of the photoexposed regions and the non-photoexposed regions relative to the other of the photoexposed regions and the non-photoexposed regions; and
    forming linear structures substantially laterally aligned with at least some of the structures using the other regions of the patterned photoresist material comprises forming the linear structures to be substantially laterally aligned with and extend across the rows of the structures or the columns of the structures using the photoexposed regions or the non-photoexposed regions of the patterned photoresist material remaining after the development of the patterned photoresist material.

15. The method of claim 14, wherein the preliminary structure further comprises a conductive material positioned longitudinally between the substrate and the photoresist material, and wherein:
    developing the patterned photoresist material to selectively remove some regions of the patterned photoresist material relative to other regions of the patterned photoresist material comprises selectively removing the non-photoexposed regions relative to the photoexposed regions; and
    forming linear structures substantially laterally aligned with at least some of the structures using the other regions of the patterned photoresist material comprises substantially removing portions of the conductive material not covered by the photoexposed regions.

16. The method of claim 14, wherein the preliminary structure further comprises a dielectric material positioned longitudinally between the substrate and the photoresist material, and wherein:
    developing the patterned photoresist material to selectively remove some regions of the patterned photoresist material relative to other regions of the patterned photoresist material comprises selectively removing the photoexposed regions relative to the non-photoexposed regions; and
    forming linear structures substantially laterally aligned with at least some of the structures using the other regions of the patterned photoresist material comprises:
        removing portions of the dielectric material not covered by the non-photoexposed regions to form trenches at least partially extending through the dielectric material; and
        filling the trenches with a conductive material.

17. The method of claim 1, wherein forming a preliminary structure comprises forming the plurality of structures to longitudinally extend at least partially into the substrate.

18. The method of claim 1, wherein forming a preliminary structure comprises forming the plurality of structures to be in direct physical contact with the photoresist material and the substrate.

* * * * *